US012256541B2

United States Patent
Ramaswamy et al.

(10) Patent No.: US 12,256,541 B2
(45) Date of Patent: Mar. 18, 2025

(54) APPARATUS AND METHOD INCLUDING MEMORY DEVICE HAVING 2-TRANSISTOR VERTICAL MEMORY CELL

(71) Applicant: Micron Technology, Inc., Boise, ID (US)

(72) Inventors: Durai Vishak Nirmal Ramaswamy, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 17/515,024

(22) Filed: Oct. 29, 2021

(65) Prior Publication Data

US 2023/0132576 A1 May 4, 2023

(51) Int. Cl.
| | |
|---|---|
| *H10B 41/35* | (2023.01) |
| *H01L 21/02* | (2006.01) |
| *H01L 29/24* | (2006.01) |
| *H01L 29/66* | (2006.01) |
| *H01L 29/786* | (2006.01) |
| *H01L 29/788* | (2006.01) |

(52) U.S. Cl.
CPC ....... *H10B 41/35* (2023.02); *H01L 21/02565* (2013.01); *H01L 29/24* (2013.01); *H01L 29/66969* (2013.01); *H01L 29/78642* (2013.01); *H01L 29/7869* (2013.01); *H01L 29/7889* (2013.01)

(58) Field of Classification Search
CPC ............. H10B 41/35; H01L 29/78642; H01L 29/7869; H01L 29/7889; H01L 29/66969; H01L 21/02565
See application file for complete search history.

(56) References Cited

U.S. PATENT DOCUMENTS

| | | | |
|---|---|---|---|
| 2019/0067475 A1* | 2/2019 | Liu | ........................ H01L 29/267 |
| 2020/0211602 A1* | 7/2020 | Karda | .................. H01L 29/7889 |
| 2021/0066196 A1 | 3/2021 | Karda et al. | |

(Continued)

FOREIGN PATENT DOCUMENTS

| | | |
|---|---|---|
| JP | H05110016 | 4/1993 |
| TW | 202115872 | 4/2021 |

OTHER PUBLICATIONS

"International Application Serial No. PCT US2022 047708, International Search Report mailed Mar. 2, 2023", 3 pages.

(Continued)

*Primary Examiner* — Vincent Wall
(74) *Attorney, Agent, or Firm* — Schwegman Lundberg & Woessner, P.A.

(57) ABSTRACT

Some embodiments include apparatuses and methods of forming the apparatuses. One of the apparatuses includes a memory cell including a first transistor, a second transistor, and a dielectric structure formed in a trench. The first transistor includes a first channel region, and a charge storage structure separated from the first channel region. The second transistor includes a second channel region formed over the charge storage structure. The dielectric structure includes a first dielectric portion formed on a first sidewall of the trench, and a second dielectric portion formed on a second sidewall of the trench. The charge storage structure is between and adjacent the first and second dielectric portions.

20 Claims, 26 Drawing Sheets

(56) References Cited

U.S. PATENT DOCUMENTS

2021/0066301 A1    3/2021   Karda et al.
2021/0066302 A1    3/2021   Karda et al.

OTHER PUBLICATIONS

"International Application Serial No. PCT US2022 047708, Written Opinion mailed Mar. 2, 2023", 6 pages.
"Taiwanese Application Serial No. 111139449, Office Action mailed Oct. 6, 2023", with English translation, 15 pages.

\* cited by examiner

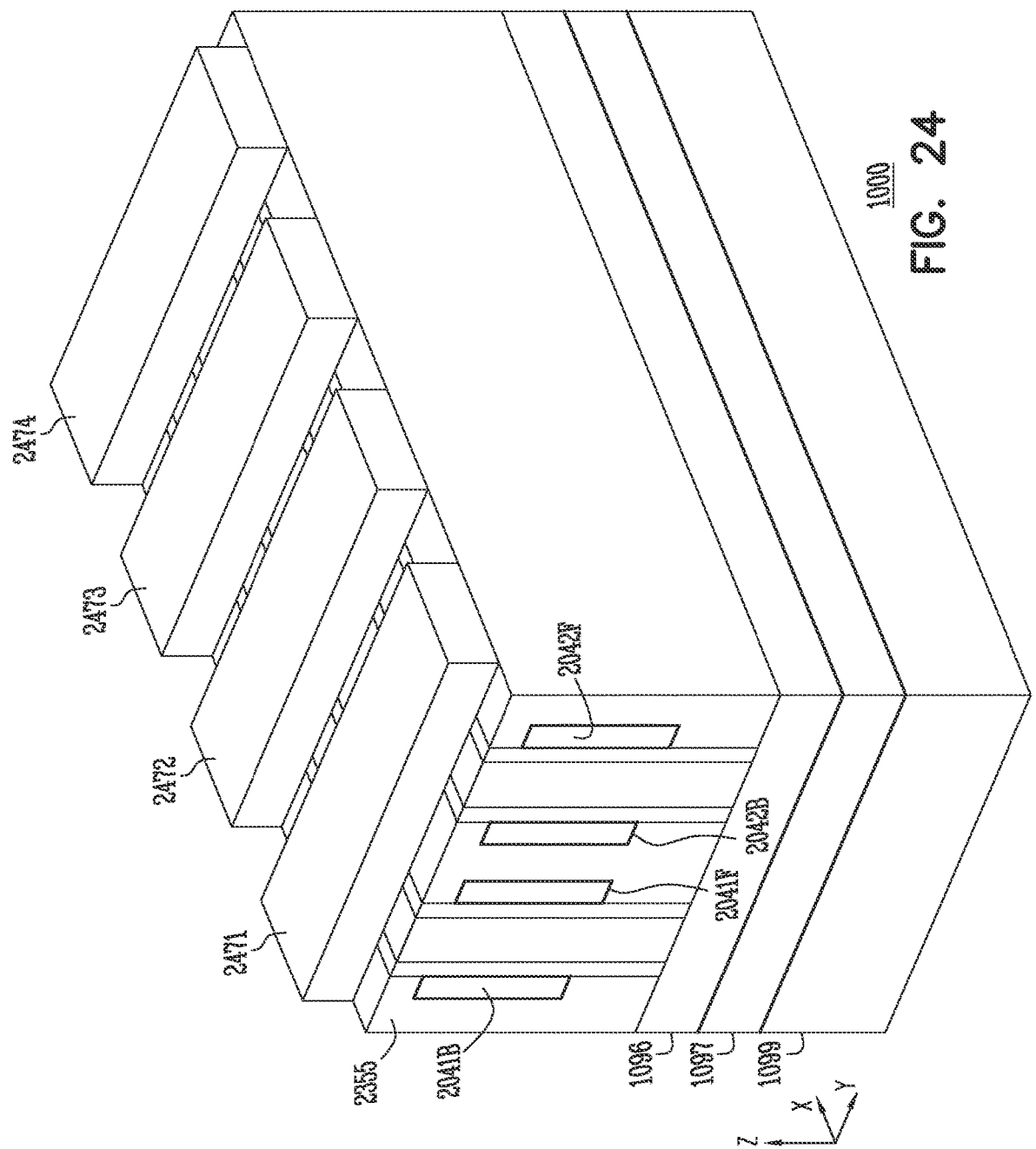

APPARATUS AND METHOD INCLUDING MEMORY DEVICE HAVING 2-TRANSISTOR VERTICAL MEMORY CELL

BACKGROUND

Memory devices are widely used in computers and many other electronic items to store information. Memory devices are generally categorized into two types: volatile memory device and non-volatile memory device. A memory device usually has numerous memory cells in which to store information. In a volatile memory device, information stored in the memory cells is lost if power supply is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

BRIEF DESCRIPTION OF THE DRAWINGS

FIG. 10 through FIG. 24 show processes of forming a memory device, according to some embodiments described herein.

DETAILED DESCRIPTION

The techniques described herein involve a memory device having volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size (e.g., footprint) of the memory device to be relatively smaller than the size (e.g., footprint) of similar conventional memory devices. The described memory device can include a single access line (e.g., word line) to control two transistors of a corresponding memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. The techniques described herein also involve processes of forming a memory device to achieve a more reliable structure (e.g., improved read and write channel regions) for the memory device. Other improvements and benefits of the described memory device and its variations are discussed below with reference to FIG. 1 through FIG. 25C.

Figure 1:
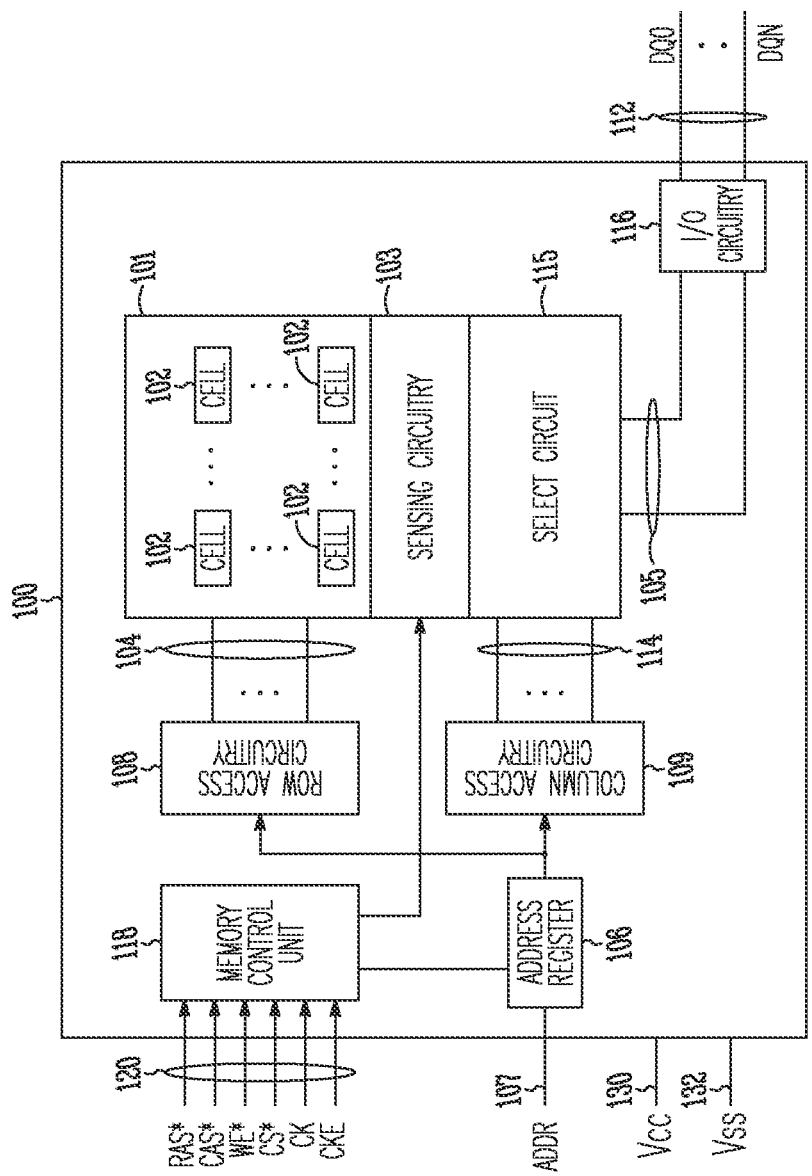
FIG. 1 shows a block diagram of an apparatus in the form of a memory device including memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 25C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 25C.

Figure 2:
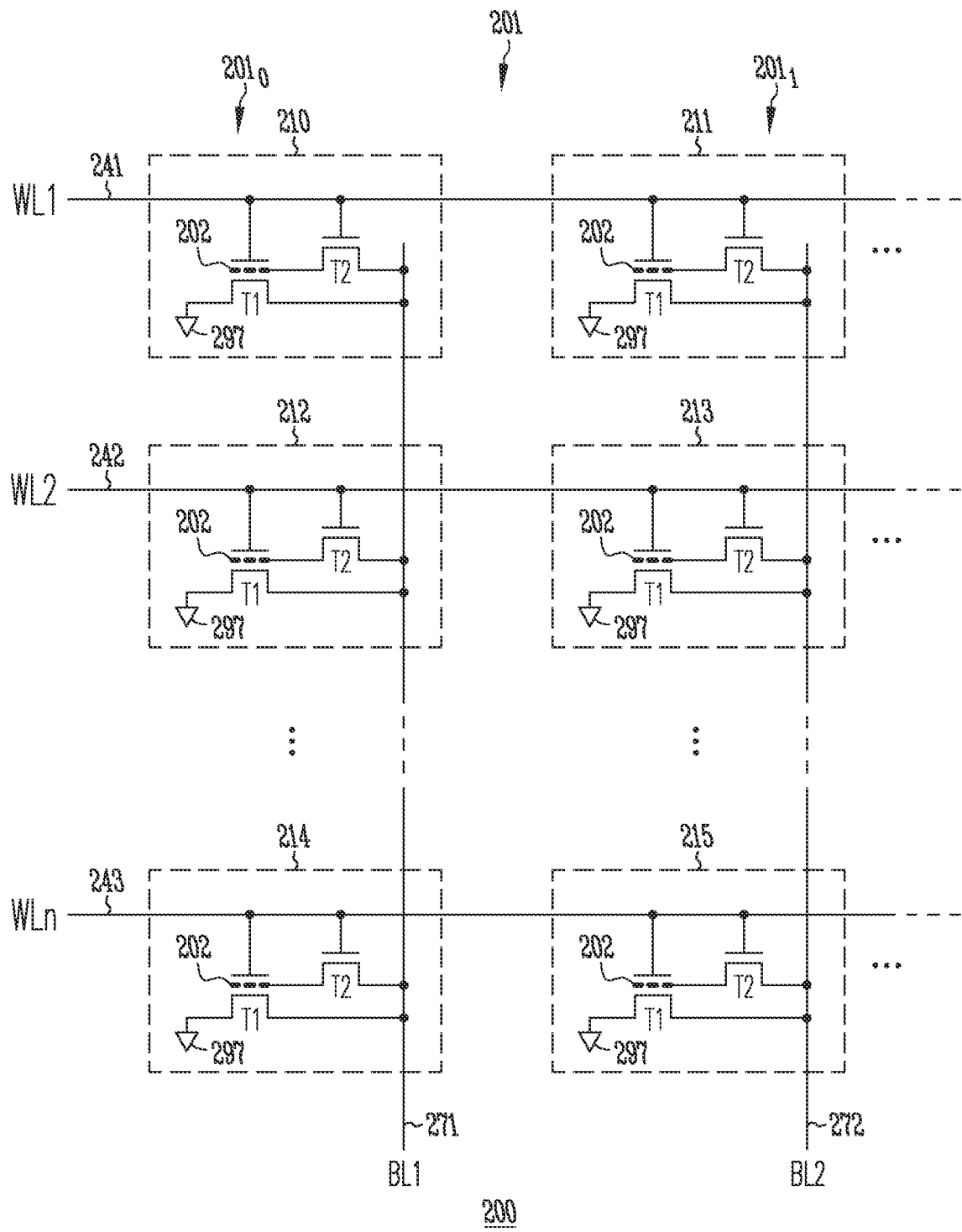
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. For example, the value of information stored in a particular memory cell among memory cells 210 through 215 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271 or 272) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. In the physical structure of memory device 200, each of access lines 241, 242, and 243 can be structured as (can be formed from) at least one conductive line (one conductive line or multiple conductive lines where the multiple conductive lines can be electrically coupled (e.g., shorted) to each other).

Access lines 241, 242, and 243 can be selectively activated (e.g., activated one at a time) during an operation (e.g., read or write operation) of memory device 200 to access a selected memory cell (or selected memory cells) among memory cells 210 through 215. A selected memory cell can be referred to as a target memory cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 271 or 272) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate (not labeled in FIG. 2) of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the physical structure of memory device 200, four different portions of a conductive material (e.g., four different portions of continuous piece of metal or polysilicon) that forms access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (e.g., four different portions of continuous piece of metal or polysilicon) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (e.g., four different portions of continuous piece of metal or polysilicon) that form access line 243 can form the gates (e.g., four gates) of transistors T1 and T2 of memory cell 214 and the gates of transistors T1 and T2 of memory cell 215, respectively.

In this description, a material can include a single material or a combination of multiple materials. A conductive material can include a single conductive material or combination of multiple conductive materials.

Memory device 200 can include data lines (e.g., bit lines) 271 and 272 that can carry respective signals (e.g., bit line signals) BL1 and BL2. During a read operation, memory device 200 can use data line 271 to obtain information read (e.g., sensed) from a selected memory cell of memory cell group $201_0$, and data line 272 to read information from a selected memory cell of memory cell group $201_1$. During a write operation, memory device 200 can use data line 271 to provide information to be stored in a selected memory cell of memory cell group $201_0$, and data line 272 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to a ground terminal of memory device 200.

As an example, ground connection 297 can be part of a common conductive structure (e.g., a common conductive plate) that can be formed on a level of memory device 200 that is under the memory cells (e.g., memory cells 210 through 215) of memory device 200. In this example, the elements (e.g., part of transistors T1 and T2 or the entire transistors T1 and T2) of each of the memory cells (e.g., memory cells 210 through 215) of memory device 200 can be formed (e.g., formed vertically) over the common conductive structure (e.g., a common conductive plate) and electrically coupled to the common conductive structure.

In another example, ground connection 297 can be part of separate conductive structures (e.g., separate conductive strips) that can be formed on a level of memory device 200 that is under the memory cells (e.g., memory cells 210 through 215) of memory device 200. In this example, the elements (e.g., part of transistors T1 and T2) of each of the memory cells (e.g., memory cells 210 through 215) of memory device 200 can be formed over (e.g., formed vertically) respective conductive structures (e.g., respective conductive strips) among the separate conductive structures (e.g., separate conductive strips) and electrically coupled to the respective conductive structures.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 271 or 272). Thus, a circuit path (e.g., current path) can be formed between a respective data line (e.g., data line 271 or 272) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 271, and ground connection 297. In memory cell group $201_1$, a read path of a particular memory cell (e.g., memory cell 211, 213, or 215) can include a current path (e.g., read current path) through a channel region of transistor T1 of that particular memory cell, data line 272, and ground connection 297. In the example where transistor T1 is a PFET (e.g., a PMOS), the current in the read path (e.g., during a read operation) can include a hole conduction (e.g., hole conduction in the direction from data line 271 to ground connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group 201, a write path of a particular memory cell can include transistor T2 (e.g., can include a write current path through a channel region of transistor T2) of that particular memory cell and data line 271. In memory cell group $201_1$, a write path of a particular memory cell (e.g., memory cell 211, 213, or 215) can include transistor T2 (e.g., can include a write current path through a channel region of transistor T2) of that particular memory cell and data line 272. In the example where transistor T2 is an NFET (e.g., NMOS), the current in a write path (e.g., during a write operation) can include an electron conduction (e.g., electron conduction in the direction from data line 271 to charge storage structure 202) through the channel region (e.g., n-channel region) of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1", where Vt1 for state "0"=0V (or alternatively Vt1 for state "0">0V), and Vt1<Vt2.

During a read operation of memory device 200, only one memory cell of the same memory cell group can be selected one at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 271, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 272, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 271, and detect a current (e.g., current I2, not shown) on a read path that includes data line 272. The value of the detected current can be based on the value of information stored in the selected memory cell. For example, depending on the value of information stored in the selected memory cell of memory cell group $201_0$, the value of the detected current (e.g., the value of current I1) on data line 271 can be zero or greater than zero. Similarly, depending on the value of information stored in the selected memory cell of memory cell group $201_1$, the value of the detected current (e.g., the value of current I2) on data line 272 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 271 and transistor T2 of the selected memory cell (e.g., memory cell 210, 212, or 214). Information to be stored in a selected memory cell of memory cell group $201_1$ during a write operation can be provided through a write path (described above) that includes data line 272 and transistor T2 of the selected memory cell (e.g., memory cell 211, 213, or 215). As described above, the value (e.g., binary value) of information stored in a particular memory cell among memory cells 210 through 215 can be based on the amount of charge in the charge storage structure 202 of that particular memory cell.

In a write operation, the amount of charge in the charge storage structure 202 of a selected memory cell can be changed (to reflect the value of information stored in the selected memory cell) by applying a voltage on a write path that includes transistor T2 of that particular memory cell and the data line (e.g., data line 271 or 272) coupled to that particular memory cell. For example, a voltage having one value (e.g., 0V) can be applied on data line 271 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 271 (e.g., provide a positive voltage to signal BL1) if information to be stored in a selected memory cell among memory cells 210, 212, and 214 has another value (e.g., "1"). Thus, information can be stored (e.g., directly stored) in the charge storage structure 202 of a particular memory cell by providing the information to be stored (e.g., in the form of a voltage) on a write path (that includes transistor T2) of that particular memory cell.

Figure 3:
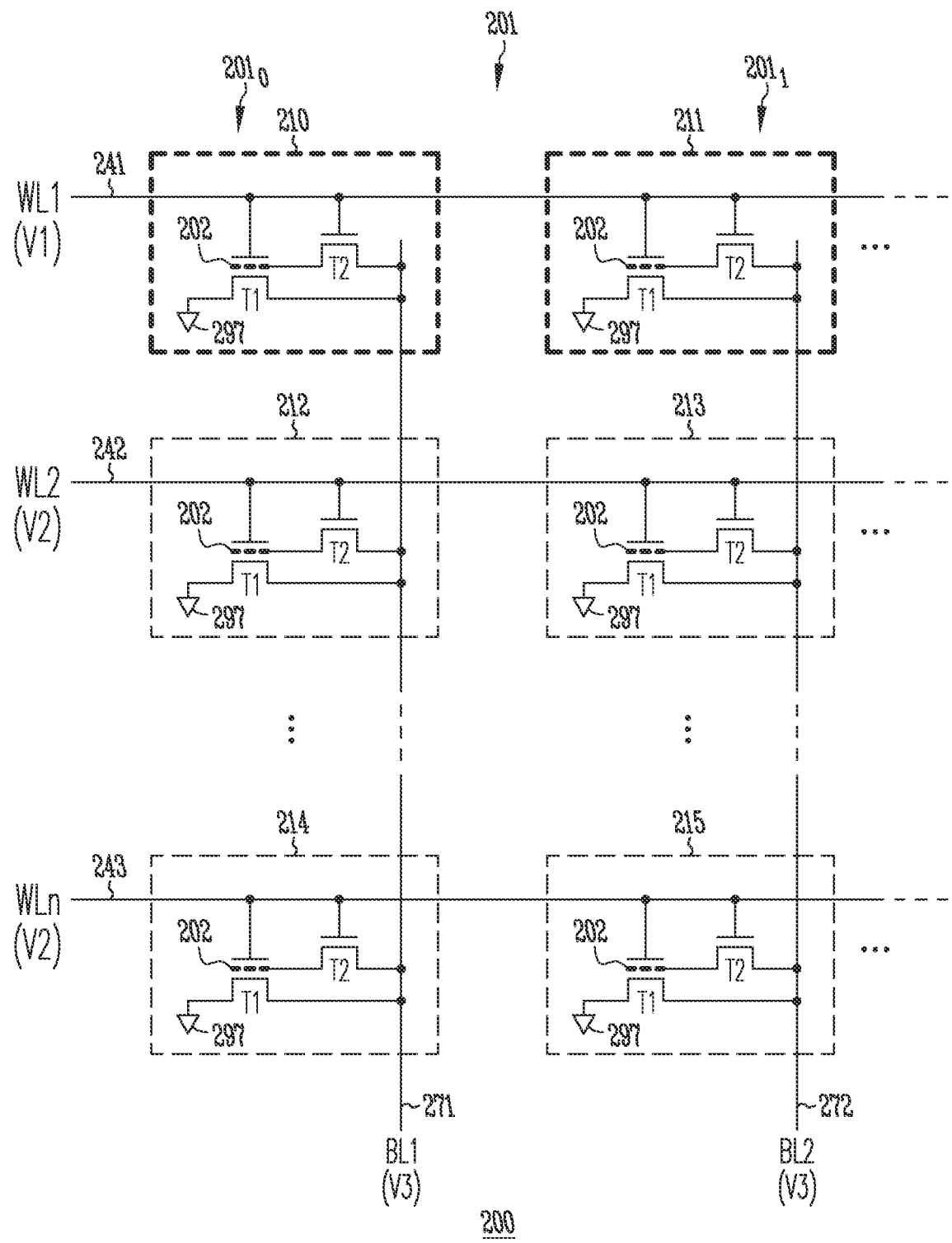
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3. In this example, access line 241 can be called a selected access line (e.g., selected word line), which is the access line associated with (e.g., coupled to) selected memory cells (e.g., memory cells 210 and 211 in this example). In this example, access lines 242 and 243 can be called unselected access lines (e.g., unselected word line), which are the access lines associated with (e.g., coupled to) unselected memory cells (e.g., memory cells 212, 213, 214, and 215 in this example).

In FIG. 3, voltages V1, V2, and V3 can represent different voltages applied to respective access lines 241, 242, and 243 and data lines 271 and 272 during a read operation of memory device 200. Voltage V1 can be applied to the selected access line (e.g., access line 241). In a read operation. Voltage V2 can be applied to the unselected access lines (e.g., access lines 242 and 243).

Voltages V1, V2, and V3 can have different values. As an example, voltages V1. V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value such that transistors T1 and T2 of each of memory cells 212 through 215 (unselected memory cells in this example) are turned off (e.g., kept off). Voltage V3 can have a value such that a current (e.g., read current) may be formed on a read path that includes data line 271 and transistor T1 of memory cell 210, and a read path (a separate read path) that includes data line 272 and transistor T1 of memory cell 212. This allows a detection of current on the read paths (e.g., on respective data lines 271 and 272) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 271 and 272 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 271 (through transistor T1 of memory cell 210). In this example, transistor T1 of memory cell 211 can also turn on and conduct a current on data line 272 (through transistor T1 of memory cell 211). Memory device 200 can determine the value of information stored in memory cells 210 and 211 based on the value of the currents on data lines 271 and 272, respectively. As described above, memory device 200 can include detection circuitry to measure the value of currents on data lines 271 and 272 during a read operation.

Figure 4:
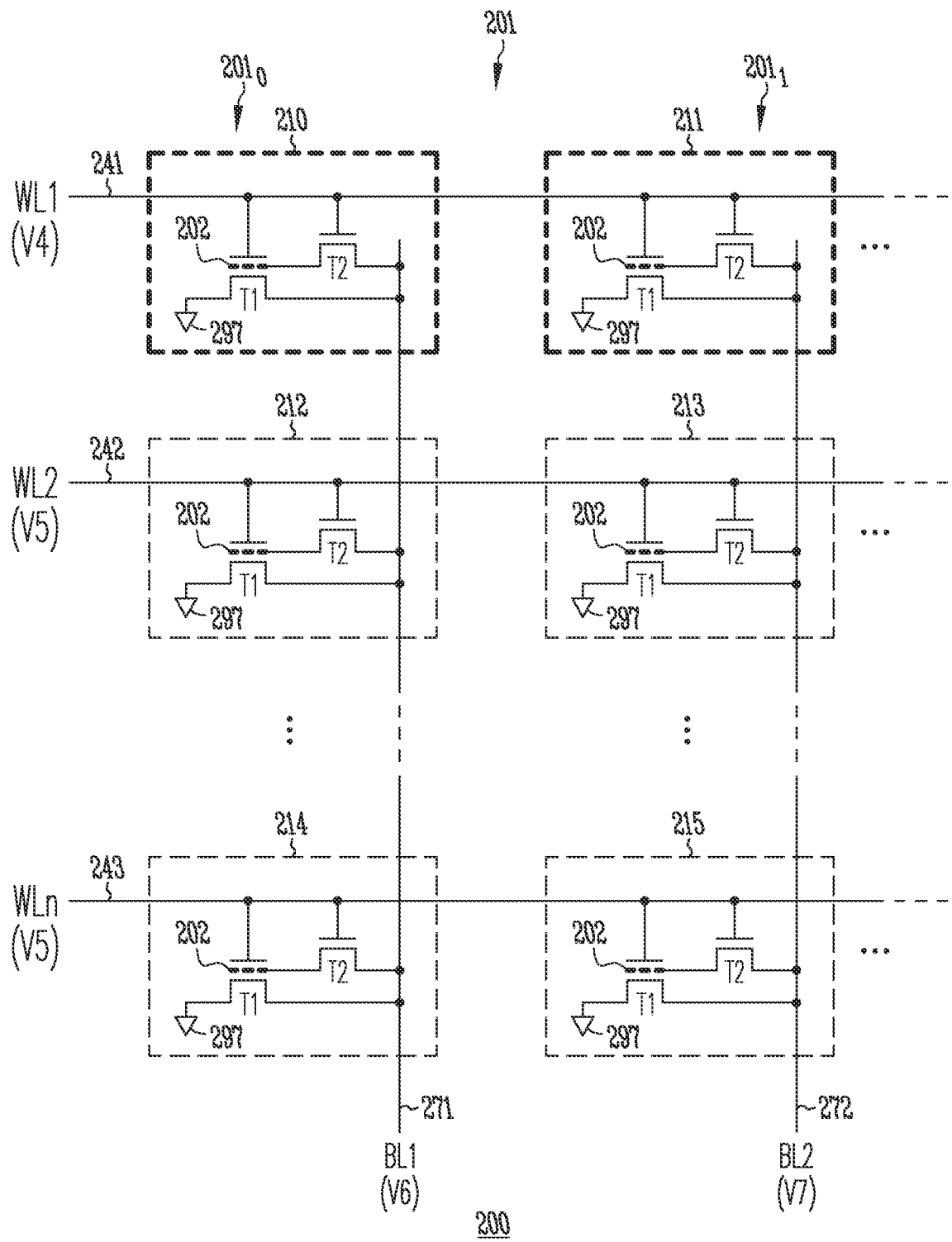
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243 and data lines 271 and 272 during a write operation of memory device 200. In a write operation, voltage V4 can be applied to the selected access line (e.g., access line 241). Voltage V5 can be applied to the unselected access lines (e.g., access lines 242 and 243).

Voltages V4, V5, V6, and V7 can have different values. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+ (e.g., V+ is a positive voltage (e.g., from 1V to 3V)) if to be stored in each memory cell 210 and 211 is "1".

In another example, the values of voltages V6 and V7 can be different (e.g., V6≠V7) if the memory cells 210 and 211 are to store information having different values. As an example, V6=0V if "0" is to be stored in memory cell 210, and V7=V+ (e.g., V+ is a positive voltage (e.g., from 1V to 3V)) if "1" is to be stored in memory cell 211. As another example, V6=V+(e.g., V+ is a positive voltage (e.g., from 1V to 3V)) if "1" is to be stored in memory cell 210, and V7=0V if "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 271 or 272) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value (e.g., V5=0V or V5<0V), such that transistors T1 and T2 of each of memory cells 212 through 215 (unselected memory cells, in this example) are turned off (e.g., kept off). Voltage V4 can have a value (e.g., V4>0V) to turn on transistor T2 of each of memory cells 210 and 211 (selected memory cells in this example) and form a write path between charge storage structure 202 of memory cell 210 and data line 271, and a write path between charge storage structure 202 of memory cell 211 and data line 272. A current (e.g., write current) may be formed between charge storage structure 202 of memory cell 210 (selected memory cell) and data line 271. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

FIG. 5 through FIG. 9 show different views of a structure of memory device 200 of FIG. 2 with respect to the X, Y, and Z directions, according to some embodiments described herein. For simplicity, cross-sectional lines (e.g., hatch lines) are omitted from most of the elements shown in FIG. 5 through FIG. 9 and other figures (e.g., FIG. 10 through FIG. 24) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 6:
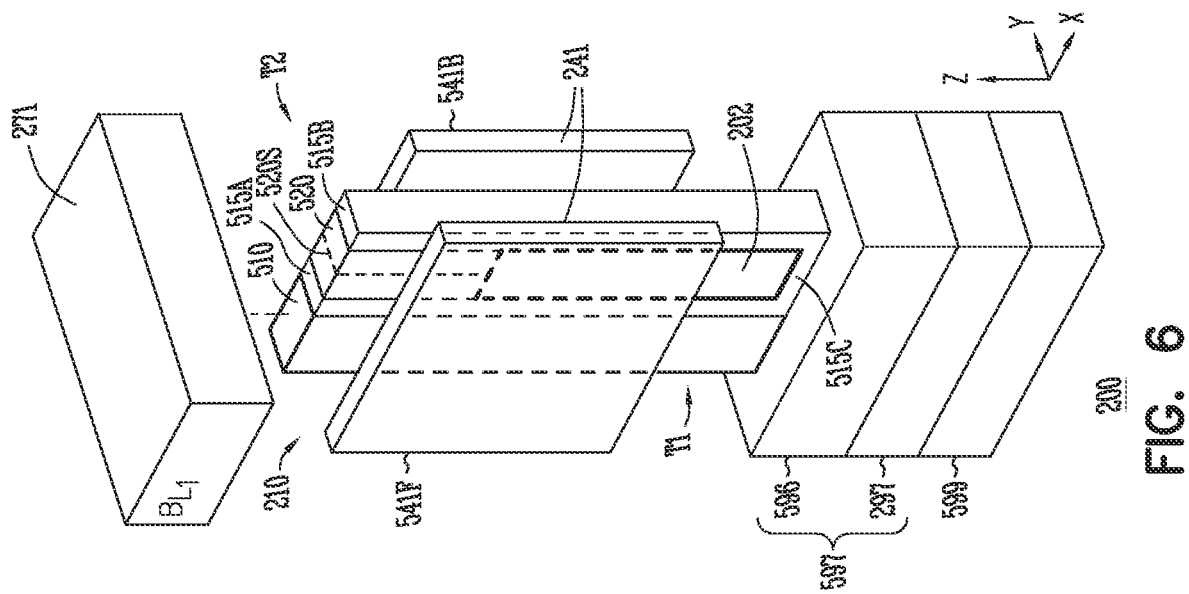
FIG. 5 through FIG. 9 show different views of a structure of the memory device of FIG. 2 including data lines having discontinuous wrapped portions, according to some embodiments described herein.
Figure 5:
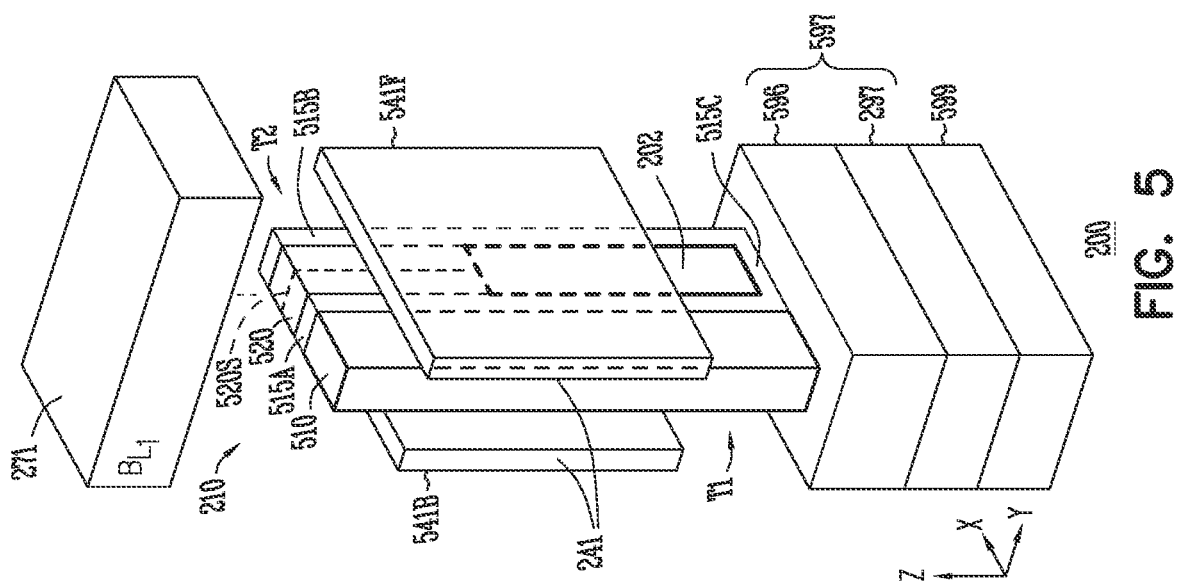
Figure 7:
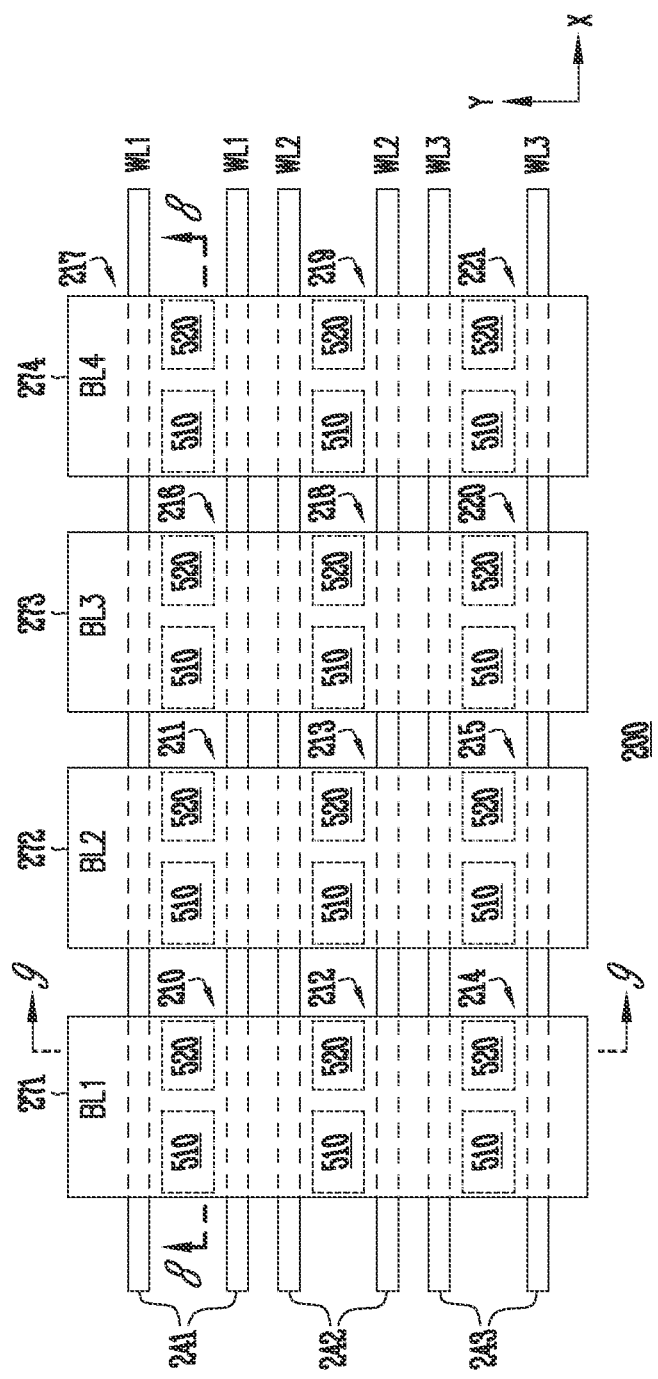
Figure 8:
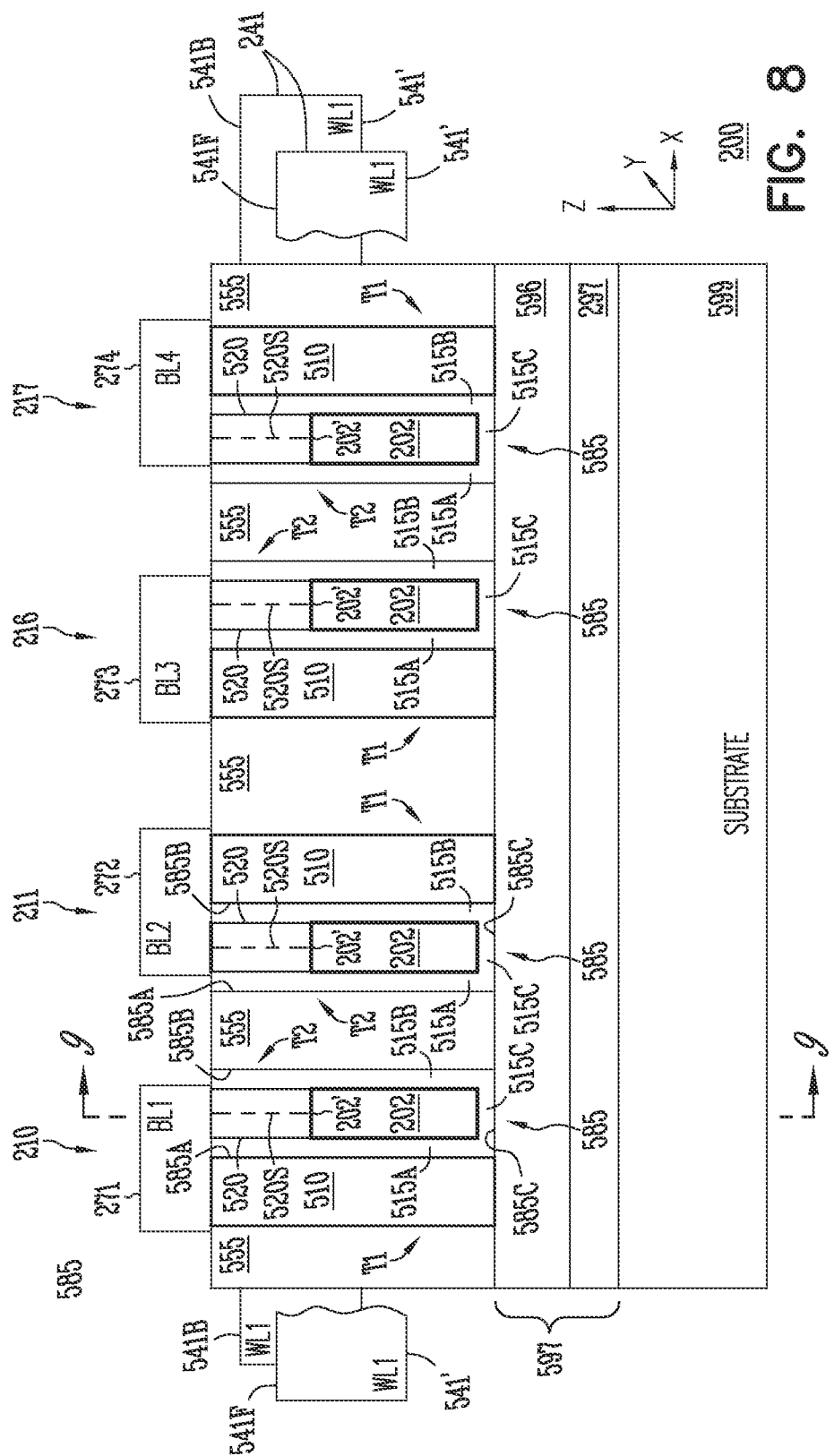
Figure 9:
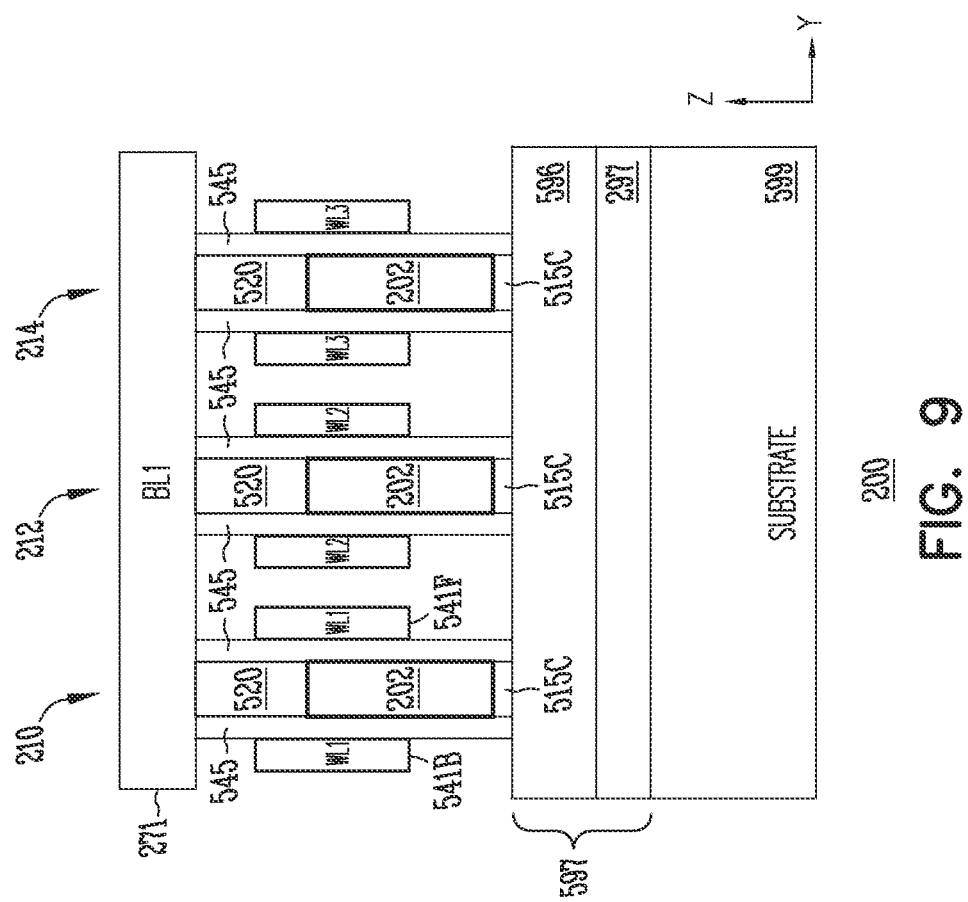

FIG. 5 and FIG. 6 show different 3-dimensional views (e.g., isometric views) of memory device 200 including memory cell 210 with respect to the X, Y, and Z directions. FIG. 7 shows a top view (e.g., plan view) of memory device 200 of FIG. 2 including relative locations of data lines 271, 272, 273, and 274 (and associated signals BL1. BL2. BL3, and BL4), and access lines 241, 242, and 243 (associated signals WL1, WL2, WL3, and WL4). FIG. 7 shows memory cells 216 and 217 and associated data lines 273 and 274 that are not shown in FIG. 2. However, as shown in FIG. 7, memory cells 216 and 217 can share access line 241 with memory cells 210 and 211. FIG. 8 shows a side view (e.g., cross-sectional view) of memory device 200 of FIG. 7 including memory cells 210, 211, 216, and 217 with respect to the X-Z direction taken along line 8-8 in FIG. 7. FIG. 9 shows a view (e.g., cross-sectional view) taken along line 9-9 of FIG. 7 and FIG. 8.

The following description refers to FIG. 5 through FIG. 9. FIG. 5 and FIG. 6 show the structure of one memory cell (e.g., memory cell 210) of memory device 200. The structures of other memory cells (e.g., memory cells 211 through 221 (FIG. 7) of memory device 200 can be similar to or the same as the structure of memory cell 210 in FIG. 5 through FIG. 9.

In FIG. 2 through FIG. 9, the same elements are given the same reference numbers. Some portions (e.g., gate oxide and cell isolation structures) of memory device 200 are omitted from FIG. 5 through FIG. 9 so as to not obscure the elements of memory device 200 in the embodiments described herein.

As shown in FIG. 5, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5 and FIG. 6, ground connection 297 (also described above with reference to FIG. 2) can include a structure (e.g., a piece (e.g., a layer)) of conductive material (e.g., conductive region) located over (formed over) substrate 599. Example materials for ground connection 297 include a piece of metal, conductively doped polysilicon, or other conductive materials. Ground connection 297 can be coupled to a ground terminal (not shown) of memory device 200. FIG. 5 and FIG. 6 show ground connection 297 contacting (e.g., directly coupled to) substrate 599 as an example. In an alternative structure, memory device 200 can include a dielectric (e.g., a layer of dielectric material, not shown) between ground connection 297 and substrate 599.

As shown in FIG. 5 and FIG. 6 (also shown in FIG. 8 and FIG. 9), memory device 200 can include a semiconductor material 596 formed over ground connection 297. Semiconductor material 596 can include a structure (e.g., a piece (e.g., a layer)) of silicon, polysilicon, or other semiconductor material, and can include a doped region (e.g., p-type doped region), or other conductive materials.

As shown in FIG. 5 and FIG. 6 (also shown in FIG. 8 and FIG. 9), memory device 200 can include a conductive region 597 (e.g., a common conductive plate) under the memory cells (e.g., memory cells 210, 211, 216, and 217 in FIG. 8) of memory device 200. Conductive region 597 can include at least one of the materials (e.g., doped polysilicon) of semiconductor material 596 and the material (e.g., metal or doped polysilicon) of ground connection 297. For example, conductive region 597 can include the material of semiconductor material 596, the material of ground connection 297, or the combination of the materials of semiconductor material 596 and ground connection 297. Thus, as shown FIG. 8, the memory cells (e.g., memory cells 210, 211, 216, and 217) of memory device 200 can share conductive region 597 (which can include any combination of semiconductor material 596 and ground connection 297).

As shown in FIG. 8, the memory cells (e.g., memory cells 210, 211, 216, and 217) of memory device 200 can share (e.g., can electrically couple to) semiconductor material 596. For example, the read channel regions of the memory cells (e.g., material 510 of each of memory cells 210, 211, 216, and 217) of memory device 200 can contact (e.g., can be electrically coupled to) semiconductor material 596.

As shown in FIG. 5 and FIG. 6 (also shown in FIG. 8 and FIG. 9), access line 241 can be structured by (can include) a combination of a portion 541F and a portion 541B. Portions 541F and 541B can be called front and back conductive portions (e.g., conductive regions) that are opposite from each other in respect to (looking from) the Y-direction. Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include a structure (e.g., a piece (e.g., a layer)) of conductive material (e.g., metal, conductively doped polysilicon, or other conductive materials). Each of portions 541F and 541B can have a length (shown in FIG. 5. FIG. 6, and FIG. 8) in the X-direction, a width (shown in FIG. 5, FIG. 6, FIG. 8, and FIG. 9) in the Z-direction, and a thickness in the Y-direction.

Portion 541F can form a gate (transistor gate) of transistor T1 of memory cell 210 and a gate (transistor gate) of transistor T2 of memory cell 210. Portion 541B can also form a gate (transistor gate) of transistor T1 of memory cell 210 and a gate (transistor gate) of transistor T2 of memory cell 210.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, one of the two portions (e.g., portions 541F and 541B) of each of the access lines of memory device 200 can be omitted. For example, either portion 541F or portion 541B be omitted, such that access line 241 can include only either portion 541F or portion 541B. In the structure shown in FIG. 5 through FIG. 9, including two portions (e.g., portions 541F and 541B) in each access line and can help better control transistor T1 (FIG. 2 and FIG. 5) of each of the memory cells of memory device 200 during a read operation.

Charge storage structure 202 (FIG. 5. FIG. 6, FIG. 8, and FIG. 9) of each memory cell of memory device 200 can include a charge storage material (or a combination of materials), which can include a piece (e.g., a layer) of charge storage material. Examples materials for charge storage structure 202 include semiconductor material (e.g., doped or undoped polysilicon), metal, titanium nitride (TiN), or other materials that can trap or hold charge. Thus, in some examples, charge storage structure 202 can include a piece (e.g., a layer) of doped or undoped polysilicon), a piece (e.g., a layer) of metal, or a piece (e.g., a layer) of titanium nitride (TiN).

As shown in FIG. 5 and FIG. 8, charge storage structure 202 can include a portion (e.g., bottom portion) that is closer to substrate 599 than the bottom portion of each of portions 541F and 541B of access line 241.

The distance between an edge (e.g., top edge) of charge storage structure 202 and an edge (e.g., bottom edge) of respective portions 541F and 541B can vary. As shown in FIG. 8, each charge storage structure 202 can include an edge (e.g., top edge) 202', and portions 541F and 541B of access line 241 can include respective edges (e.g., bottom edges) 541'. FIG. 8 shows an example where edge 202' is at a specific distance (e.g., distance shown in FIG. 8) from edges 541'. However, the distance between edge 202' of charge storage structure 202 and edges 541' of portions 541F and 541B can vary. For example. FIG. 8 shows edges 541' being below edge 202' with respect to the Z-direction, such that the width (in the Z-direction) of each of portions 541F and 541B can overlap (in the Z-direction) both material 520 and charge storage structure 202. However, edges 541' can alternatively be above edge 202' with respect to the Z-direction, such that portions 541F and 541B overlaps material 520 and may not overlap (in the Z-direction) charge storage structure 202.

As shown in FIG. 5 through FIG. 9, memory device 200 can include material 520 located between data line 271 and charge storage structure 202. Material 520 can be electrically coupled to (e.g., directly coupled to (contact)) data line 271. Material 520 can also be electrically coupled to (e.g., directly coupled to (contact)) charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5. FIG. 6, FIG. 8, and FIG. 9, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

Material 520 can include a structure (e.g., a piece (e.g., a layer)) of semiconductor material. In the example where transistor T2 is an NFET (as described above), material 520 can include n-type semiconductor material (e.g., n-type silicon).

In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5, FIG. 6. FIG. 8, and FIG. 9, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5 through FIG. 9, memory cell 210 can include a material 510, which can include a structure (e.g., a piece (e.g., a layer)) of semiconductor material. Example materials for material 510 can include silicon, polysilicon (e.g., undoped or doped polysilicon), germanium, silicon-germanium, or other semiconductor materials and semiconducting oxide materials (oxide semiconductors, e.g., SnO or other oxide semiconductors). In an example structure of memory device 200, memory cell 210 (and other memory cells) of memory device 200 can include material (e.g., read channel region) 510 that is blanked deposited with a dopant grading and activated. In such an example structure, material 510 can be formed by processes similar to or the same as the processes of forming semiconductor material 1010 (FIG. 10) of memory device 1000 (described in detail below).

As described above with reference to FIG. 2, transistor T1 of memory cell 210 includes a channel region (e.g., read channel region). In FIG. 5 through FIG. 9, the channel region of transistor T1 of memory cell 210 can include (e.g., can be formed from) material 510. Material 510 can be electrically coupled to (e.g., directly coupled to (contact)) data line 271. As described above with reference to FIG. 2, memory cell 210 can include a read path. In FIG. 5 through FIG. 9, material 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, material 510 can conduct a current (e.g., read current (e.g., holes)) between data line 271 and ground connection 297 (through part of semiconductor material 596). The direction of the read current can be from data line 271 to ground connection 297 (through material 510 and part of semiconductor material 596). In the example where transistor T1 is a PFET and transistor T2 is an NFET, the material that forms material 510 can have a different conductivity type from material 520. For example, material 510 can include p-type semiconductor material (e.g., p-type silicon) regions, and material 520 can include n-type semiconductor material (e.g., n-type gallium phosphide (GaP)) regions.

As shown in FIG. 5. FIG. 6, and FIG. 8, memory cell 210 can include a dielectric structure (e.g., dielectric material) that can include a combination of dielectric portions 515A, 515B, and 515C. As shown in FIG. 8, dielectric portions 515A, 515B, and 515C can form a U-shape. Dielectric portions 515A, 515B, and 515C can be oxide regions (e.g., channel oxide regions) that separate material (e.g., read channel region) 510 from charge storage structure 202 and material (e.g., write channel region) 520. Dielectric portion 515C can electrically separate charge storage structure 202 from semiconductor material 596. Dielectric portions 515A, 515B, and 515C can include the same material that can be formed from the same process.

As shown in FIG. 8, memory device 200 can include trenches 585. Each of trenches 585 can include sidewalls 585A and 585B opposite from each other in the X-direction, and a bottom 585C formed by a portion of semiconductor material 596. For simplicity, the following description describes only detailed structure of trench 585 adjacent material 510 of memory cell 210. However, trenches 585 adjacent materials 510 of respective memory cells 211, 216, and 217 can have similar structure as trench 585 adjacent material 510 of memory cell 210.

As shown in FIG. 8, in trench 585 adjacent material 510 of memory cell 210, dielectric portion 515A can be formed on sidewall 585A of trench 585. Dielectric portion 515B can be formed on sidewall 585B of trench 585. Dielectric portion 515C can be formed on bottom 585C of trench 585. Dielectric portion 515C can be formed between dielectric portions 515A and 515B, and perpendicular and connecting to dielectric portions 515A and 515B. Dielectric portions 515A and 515B can have the same (e.g., substantially the same) thickness in the X-direction. Dielectric portion 515C can have the same (e.g., substantially the same) thickness in the X-direction as each of dielectric portions 515A and 515B.

As shown in FIG. 8, charge storage structure 202 can be between and adjacent (e.g., contact or indirectly contact) dielectric portions 515A and 515B. Material 520 can also be between and adjacent (e.g., contact or indirectly contact) dielectric portions 515A and 515B. Dielectric portion 515A can be located on a side (in the X-direction) of material 510. Dielectric portion 515A can also be located between material 510 and each of charge storage structure 202 and material 520. Dielectric portion 515A can contact material 510 and each of charge storage structure 202 and material 520.

In an example structure of memory device 200, material (e.g., semiconducting oxide material) 520 can be formed (e.g., formed by processes similar to or the same as the processes of forming material 2220 (FIG. 22) of memory device 1000), such that material 520 (e.g., semiconducting oxide material in FIG. 8) can include opposite sides (e.g., first and second sides in the X-direction) contacting (e.g., interfacing) respective sides of dielectric portions 815A and 815B. For example, as shown in FIG. 8, material (e.g., semiconducting oxide material) 520 can include one side (in the X-direction) that contacts dielectric portion 815A, and another side (in the X-direction) that contacts dielectric portion 815B.

As shown in FIG. 5. FIG. 6, and FIG. 8, material (e.g., semiconducting oxide material) 520 can include a portion (not labeled) adjacent dielectric portion 815A and between opposite sides (e.g., first and second sides in the X-direction) of material 520, a portion (not labeled) adjacent dielectric portion 815B and between the opposite sides of material 520, and a seam 520S at an interface between the portion adjacent dielectric portion 815A and the portion adjacent dielectric portion 815B. Seam 520S includes the same material as material 520. In an example structure of memory device 200 (FIG. 5, FIG. 6, and FIG. 8), the presence of seam 520S can be a result of the processes of forming memory device 200 including forming material 520. Such processes can be similar to or the same as the process associated with FIG. 10 through FIG. 24.

Example materials for dielectric portions 515A, 515B, and 515C include silicon dioxide, hafnium oxide (e.g., $HfO_2$), aluminum oxide (e.g., $Al_2O_3$), or other dielectric materials. In an example structure of memory device 200, dielectric portions 515A, 515B, and 515C include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 8, memory device 200 can include dielectric material (e.g., silicon dioxide) 555 that can form a structure (e.g., a dielectric structure) between respective adjacent memory cells. For example, dielectric material 555 between memory cells 210 and 211 can be located between trenches 585 in memory cells 210 and 211. Dielectric material 555 between memory cells 211 and 216 can electrically separate material 520 (e.g., read channel region of transistor T2) of memory cell 211 from material 520 (e.g., write channel region of transistor T2) of memory cell 216. As shown in FIG. 8, dielectric material 555 between memory cells 211 and 216 can between materials 520 of memory cells 211 and 216 and adjacent (e.g., contacts or indirectly contacts) materials 520 of memory cells 211 and 216.

As shown in FIG. 5 and FIG. 6, and FIG. 8, portion 541F can be adjacent part of material 510 and part of material 520 and can span across (e.g., overlap in the X-direction) part of material 510 and part of material 520 of memory cell 210 and other memory cells (e.g., memory cells 211, 216, and 217). As described above, material 510 can form part of a read channel region of transistor T1 and material 520 can form part of a write channel region of transistor T2. Thus, as shown in FIG. 5, FIG. 6, and FIG. 8, part of portion 541F can span across (e.g., overlap) part of (e.g., on a side (e.g., front side) in the Y-direction) both read and write channel regions of transistors T1 and T2, respectively. Similarly, part of portion 541B can be adjacent part of material 510 and a part of material 520, and can span across (e.g., overlap in the X-direction) part of (e.g., on another side (e.g., back side opposite from the front side) in the Y-direction) material 510 and a part of material 520.

As shown in FIG. 8, each of portions 541F and 541B of access line 241 can also span across (e.g., overlap in the X-direction) part of material 510 (e.g., a portion of the read channel region of transistor T1) and part of material 520 (e.g., a portion of write channel region of transistor T2) of other memory cells (e.g., memory cells 211, 216, and 217) of memory device 200. The spanning (e.g., overlapping) of access line 241 across material 510 and material 520 allows access line 241 (a single access line) to control (e.g., to turn on or turn off) both transistors T1 and T2 of memory cells 210, 211, 216, and 217.

As shown in FIG. 9, memory device 200 can include dielectric materials 545 (e.g., gate oxide regions) to electrically separate portions 541F and 541B of access line 241 from other elements of respective memory cells 210, 211, and 212. The material (or materials) for dielectric materials 545 can be the same as (or alternatively, different from) the material (or materials) of dielectric portions 515A, 515B, and 515C. Example materials for dielectric materials 545 can include silicon dioxide, hafnium oxide (e.g., $HfO_2$), aluminum oxide (e.g., $Al_2O_3$), or other dielectric materials.

As shown in FIG. 9, dielectric materials 545 can be oxide regions (e.g., gate oxide regions) adjacent respective sides (in the Y-direction) of material 520 and respective sides (in the Y-direction) of charge storage structure 202 of a respective memory cell. For example, dielectric materials 545 at memory cell 210 can be adjacent respective sides (e.g., right side (or front side) and left side (e.g., back side) in the Y-direction of each of material 520 and charge storage structure 202.

The structure of memory device 200 allows it to have a relatively smaller size (e.g., smaller footprint) and improved (e.g., reduced) power consumption (as result of using a single access line (e.g., word line) to control two transistors of a corresponding memory cell). Further, the structure of the memory cells of memory device 200 can allow memory device 200 to be more process-friendly in comparison to some conventional memory devices.

FIG. 10 through FIG. 24 show different views of elements during processes of forming a memory device 1000, according to some embodiments described herein. Some or all of the processes used to form memory device 1000 can be used to form memory devices 200 with reference to FIG. 2 through FIG. 9. Thus, memory device 200 can include improvements and benefits similar to or the same as those of memory device 1000, as described below.

Figure 10:
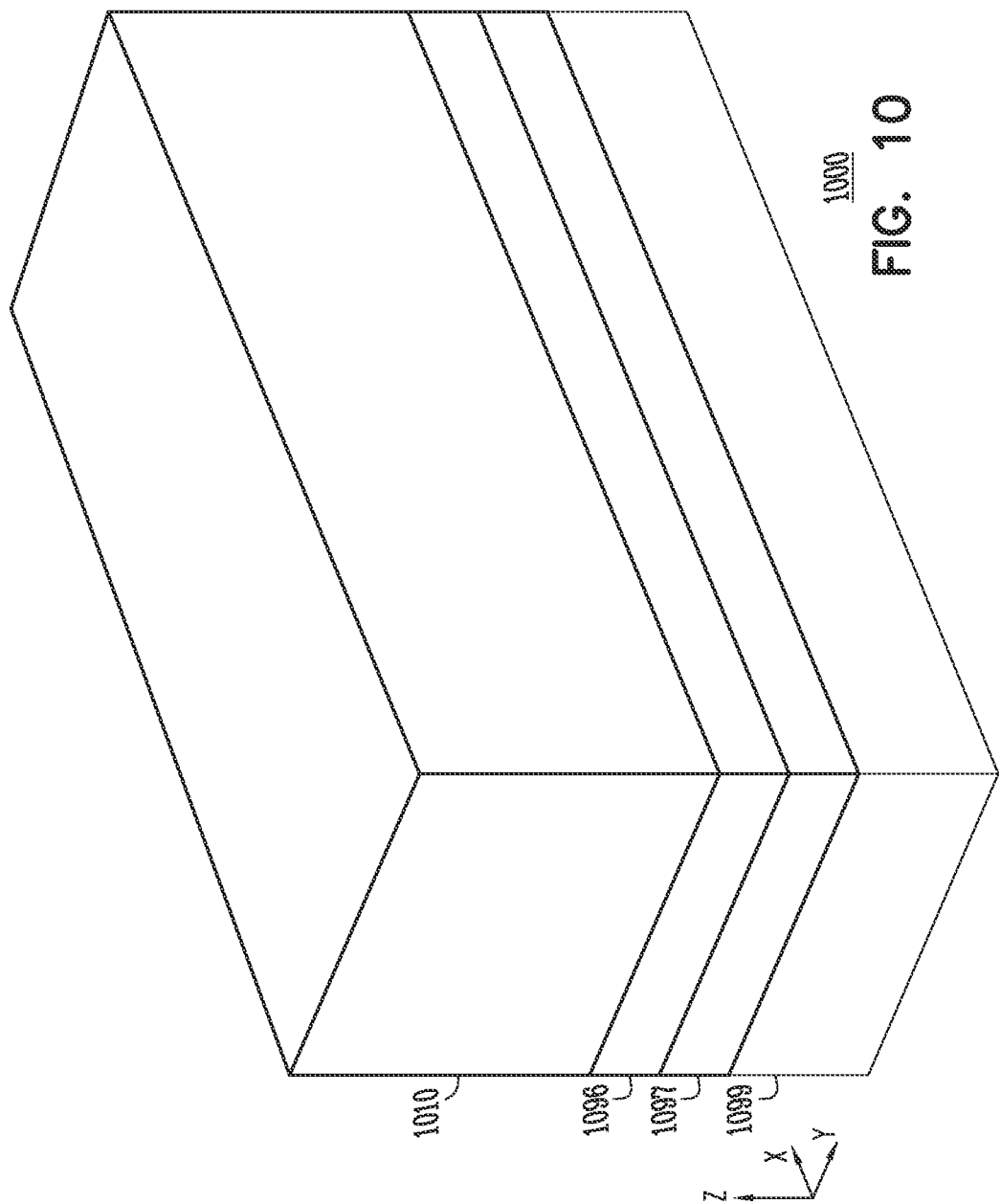

FIG. 10 shows memory device 1000 after different levels (e.g., layers) of materials are formed in respective levels (e.g., layers) of memory device 1000 in the Z-direction over a substrate 1099. The different levels of materials include a semiconductor material 1010, a semiconductor material 1096, and a conductive material 1097. Semiconductor material 1010, semiconductor material 1096, and conductive material 1097 can be formed in a sequential fashion one material after another over substrate 1099. For example, the processes used in FIG. 10 can include forming (e.g., depositing) conductive material 1097 over substrate 1099, forming (e.g., depositing) semiconductor material 1096 over conductive material 1097, and forming (e.g., depositing) semiconductor material 1010 over semiconductor material 1096.

Substrate 1099 can be similar to or the same as substrate 599 of FIG. 5. Conductive material 1097 can include a material (or materials) similar to or the same as that of the material for ground connection 297 of memory device 200 (FIG. 5 through FIG. 9). For example, conductive material 1097 can include metal, conductively doped polysilicon, or other conductive materials.

Semiconductor material 1010 of FIG. 10 be conductively doped semiconductor material and can be deposited (e.g., blanket deposited) over semiconductor material 1096. Semiconductor material 1010 can be doped with different concentration of dopants (impurities) in different portions (e.g., different layers in the Z-direction) of semiconductor material 1010. The dopants (impurities) can be p-type dopants, such that semiconductor material 1010 can be p-type semiconductor material. The concentration of dopants in semiconductor material 1010 can be graded in the Z-direction and activated, such that semiconductor material 1010 can include portions (e.g., multiple layers in the Z-direction) having different concentrations of dopants (which have been activated). As an example, semiconductor material 1010 includes p+/p−/undoped/p−/p+ portions (e.g., five layers in the Z-direction, not labeled in FIG. 10) where the p+ portion (p plus portion) has a higher p-type dopants than the p− portion (p minus portion), and the undoped semiconductor portion is between the p− portions.

Thus, the processes of forming semiconductor material 1010 can include a doping process, which can include a dopant grading process and dopant activation process. The dopant grading process can include introducing dopants having different concentrations in different portions (e.g., p+/p−/undoped/p−/p+ portions, as described above) of semiconductor material 1010. The dopant activation process can include an anneal process (e.g., a laser anneal process) for crystallization and activation of the dopants. A CMP (chemical mechanical polishing or planarization) process may be performed during formation of semiconductor material 1010.

As an example, the doping process described above can include doping a portion (e.g., p+ portion) of semiconductor material 1010 with a doping concentration, and doping another portion (e.g., p− portion) of semiconductor material 1010 with another doping concentration. The portions can be formed one over another in the Z-direction (e.g., p− portion is formed on p+ portion). Part of the processes of forming semiconductor material 1010 can further include performing additional doping processes to form other portions (e.g., other p− and p+ portions) of semiconductor material 1010. The processes of forming semiconductor material 1010 can include activating the dopants, such that semiconductor material 1010 can include graded and activated dopants. The processes of forming semiconductor material 1010 can include leaving a portion (e.g., portion between p− portions) of semiconductor material 1010 undoped. Thus, semiconductor material 1010 can be blanked deposited with a dopant grading and activated.

Semiconductor material 1010 can be similar to or the same as material 510 of memory cell 210 (FIG. 5 and FIG. 6). Thus, memory cell 210 (and other memory cells) of memory device 200 can include material (e.g., read channel region) 510 that is blanked deposited with a dopant grading and activated. In subsequent processes (FIG. 18) of forming memory device 1000, semiconductor material 1010 can be structured to form a channel region (e.g., read channel region) of a transistor (e.g., transistor T1) of a respective memory cell of memory device 1000. In the example above, semiconductor material 1010 can be p-type semiconductor material, such that the channel region (formed from semiconductor material 1010) can be a p-channel region of a PFET structure to conduct currents (e.g., holes) during an operation (e.g., read operation) of memory device 1000.

Forming semiconductor material 1010 as described above can provide improvements and benefits over some alternative processes. For example, in some alternative processes, semiconductor material 1010 can be formed on a sidewall of a trench. However, forming semiconductor material 1010 on such a sidewall may be relatively more difficult to control the doping process to achieve a graded doping that is similar to or the same as the graded doping of semiconductor material 1010 formed by the processes described above with reference to FIG. 10. Thus, the processes of forming semiconductor material 1010 described above with reference to FIG. 10 can result in better control for the doping processes than that of some alternative processes. This can lead to a more reliable structure (e.g., read channel region of transistor T1) formed from semiconductor material 1010.

Figure 11:
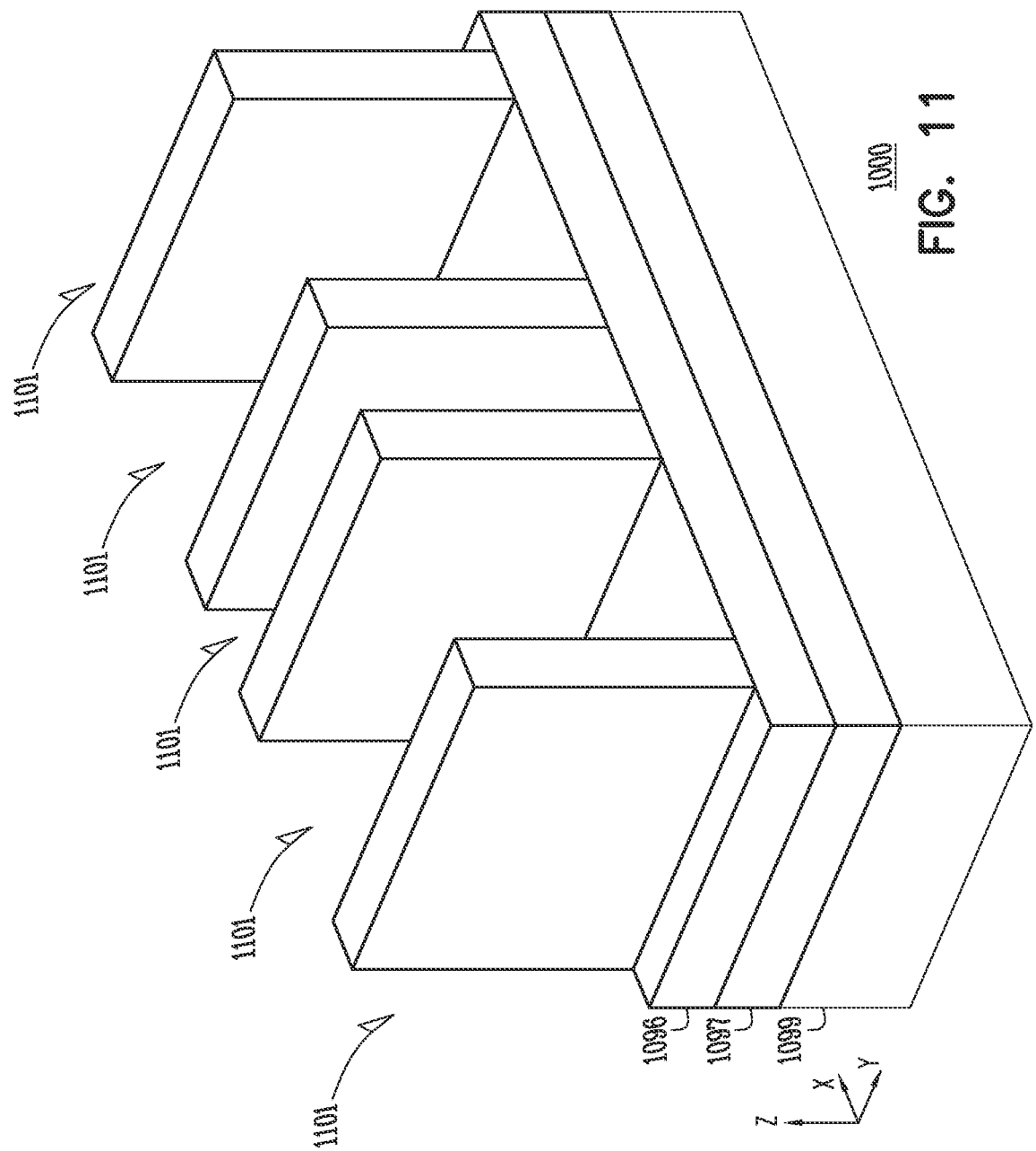

FIG. 11 shows memory device 1000 after trenches (e.g., openings) 1101 are formed. Forming trenches 1101 can include removing (e.g., by patterning) part of semiconductor material 1010 at the locations of trenches 1101. Remaining portions (a remaining part) of semiconductor material 1010 are shown in FIG. 11.

Figure 12:
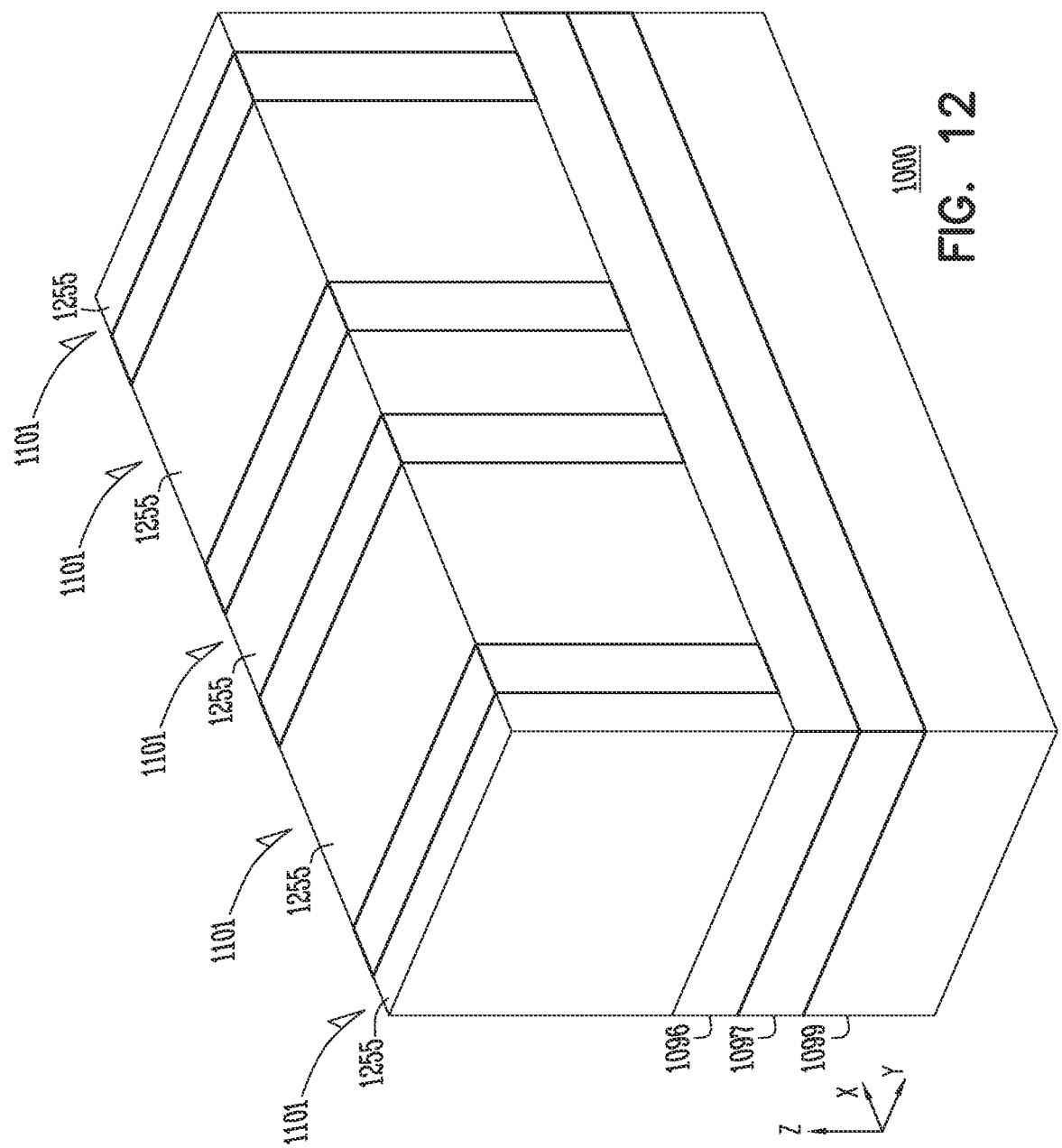

FIG. 12 shows memory device 1000 after a dielectric material 1255 is formed (e.g., filled) in trenches 1101. Dielectric material 1255 can include an oxide material. As described below in subsequent processes of forming memory device 1000, part of dielectric material 1255 can form a respective isolation structure that can electrically isolate parts of (e.g., read channel regions) of two adjacent (in the X-direction) memory cells of memory device 1000.

Figure 13:
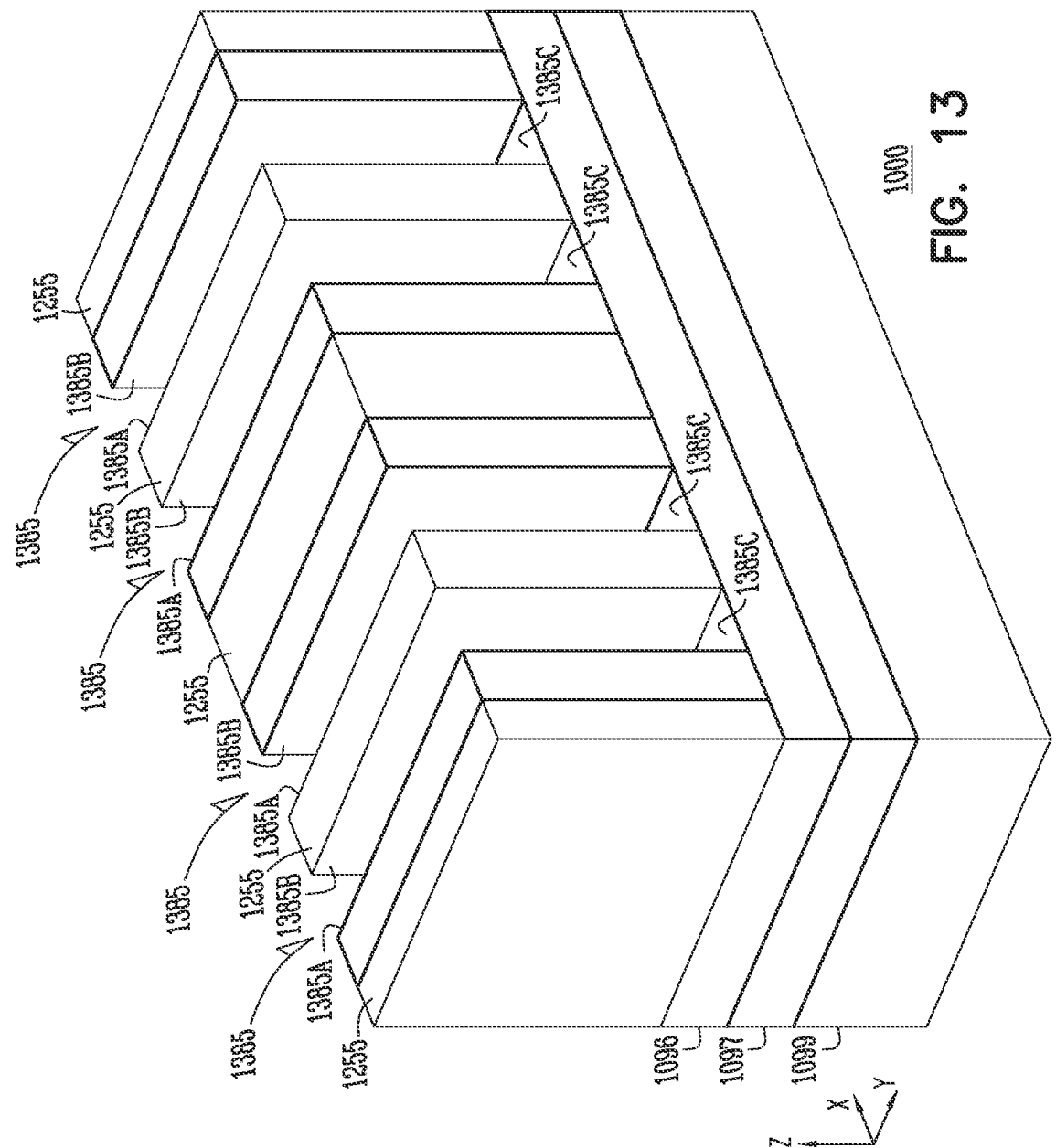

FIG. 13 shows memory device 1000 after trenches (e.g., openings) 1385 are formed in dielectric material 1255. Forming trenches 1385 can include removing (e.g., by patterning) part of dielectric material 1255 at the locations of trenches 1385. A remaining part of dielectric material 1255 is shown in FIG. 13. Each of trenches 1385 can have a length in the Y-direction and width (shorter than the length) in the X-direction. Each of trenches 1385 can include sidewalls 1385A and 1385B opposite from each other in the X-direction, and a bottom 1385C formed by a portion of material 1096. Part of trenches 1385 can correspond to trenches 585 of FIG. 8.

Figure 14:
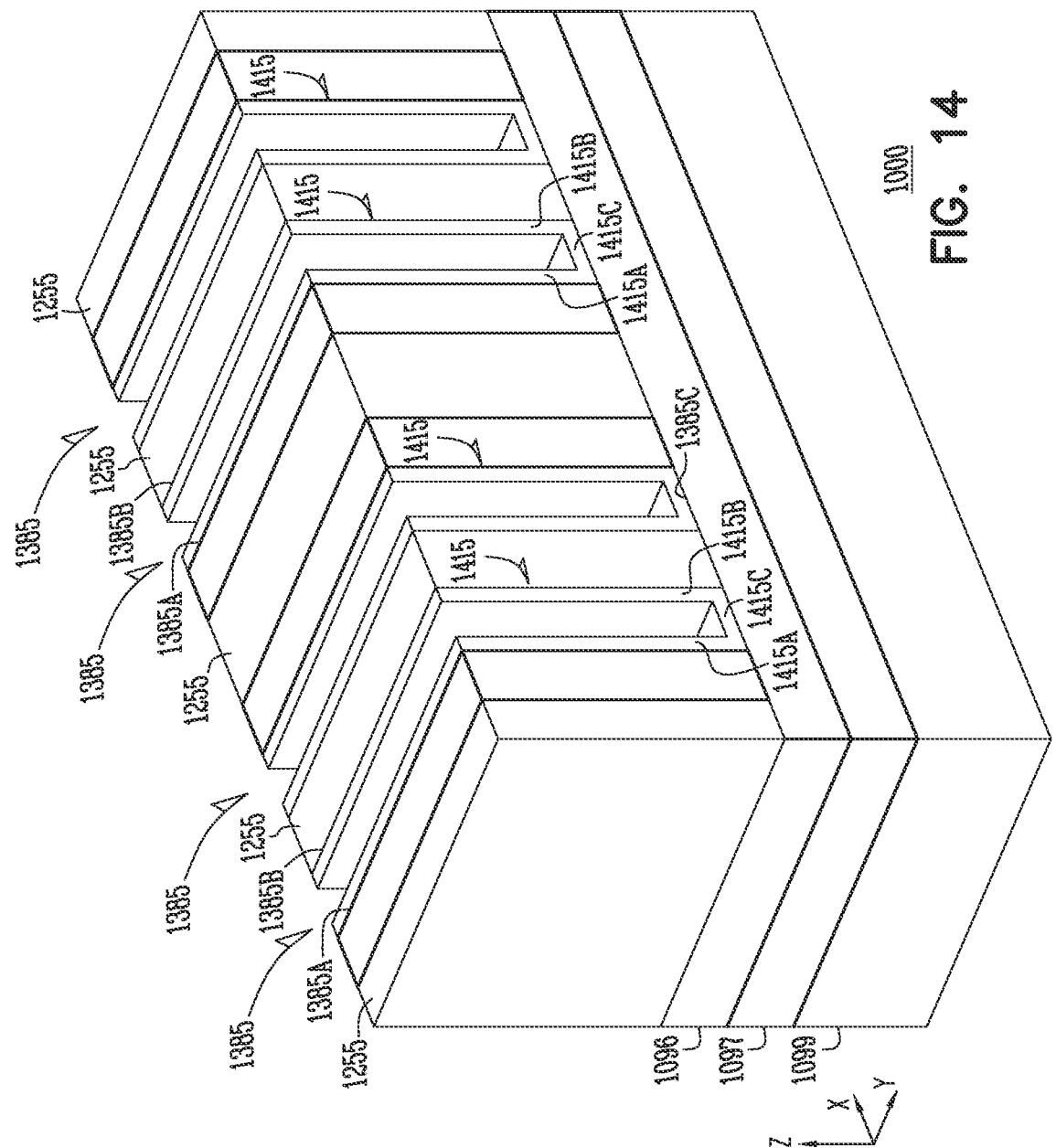

FIG. 14 shows memory device 1000 after a dielectric material 1415 is formed in each of trenches 1385. Dielectric material 1415 can include an oxide material. Dielectric material 1415 can be formed (e.g., by growing oxide or by deposition of oxide), such that dielectric material 1415 can be a relatively thin layer of material (e.g., oxide) that is conformal to sidewalls 1385A and 1385B and bottom 1385C of trench 1385. As shown in FIG. 14, dielectric material 1415 can be formed to include a dielectric portion 1415A formed on sidewall 1385A, a dielectric portion 1415B formed on sidewall 1385B, and a dielectric portion 1415C formed on bottom 1385C and between dielectric portions 1415A and 1415B. As described below in subsequent processes of forming memory device 1000, part of dielectric material 1415 can be structured to form a dielectric structure of a respective memory cell of memory device 1000.

Figure 15:
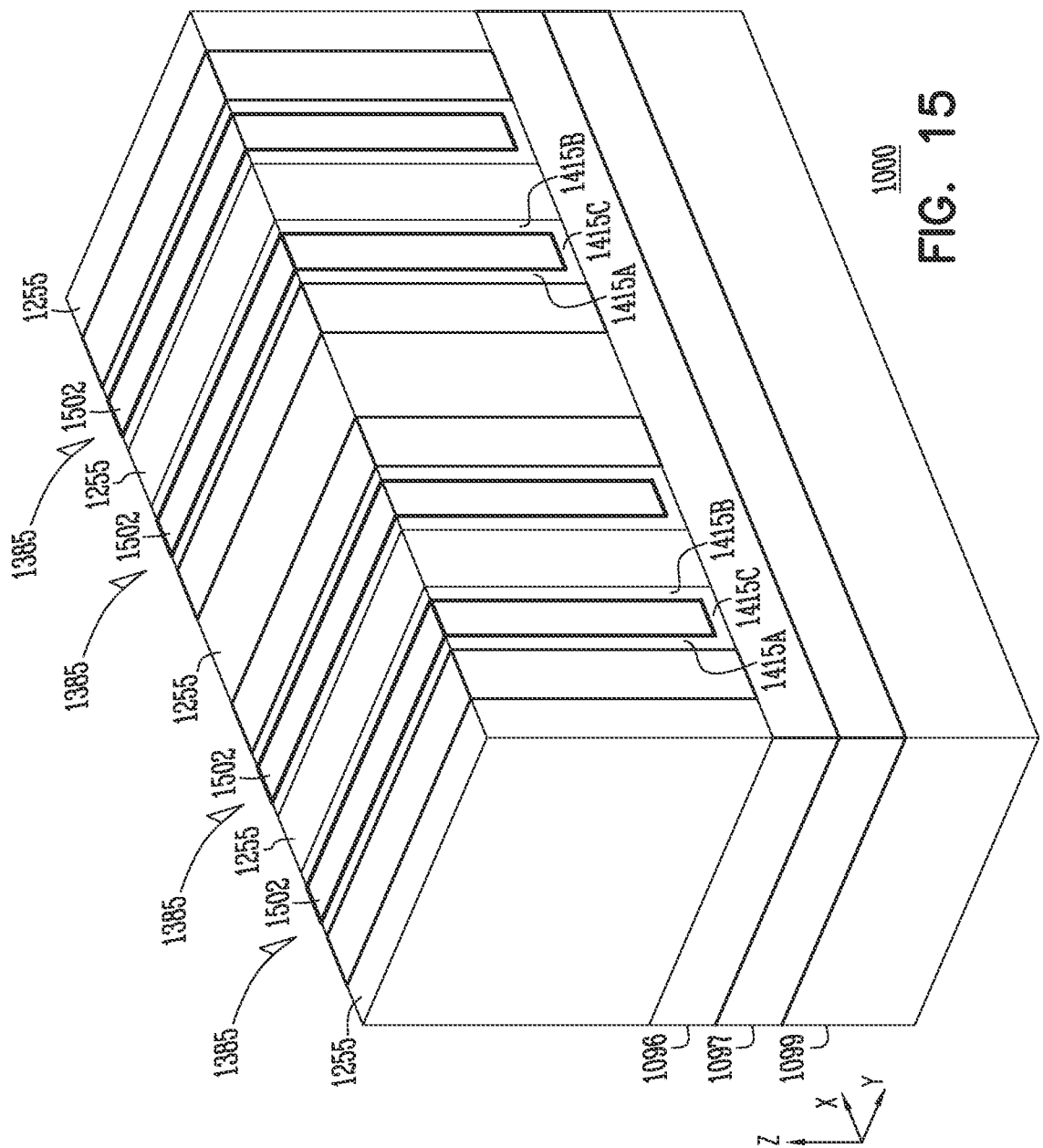

FIG. 15 shows memory device 1000 after a material (e.g., charge storage materials) 1502 is formed in each of trenches 1385. In each of trenches 1385, material 1502 can be formed over dielectric portion 1415C and between dielectric portions 1415A and 1415B. Thus, in each of trenches 1385, material 1502 can be isolated (electrically isolated from other parts of memory device 1000) on both sides (in the X-direction) of material 1502 and on the bottom side of material 1502 by dielectric portions 1415A, 1415B, and 1415C, respectively. As described below in subsequent processes (FIG. 18) of forming memory device 1000, material 1502 can be structured to form a charge storage structure of a respective memory cell of memory device 1000. Examples for material 1502 can be similar to or the same as those of material 502 of memory device 200 (FIG. 5). For example, material 1502 can include a semiconductor material (e.g., doped or undoped polysilicon), metal, titanium nitride (TiN), or other materials that can trap or hold charge.

Figure 16:
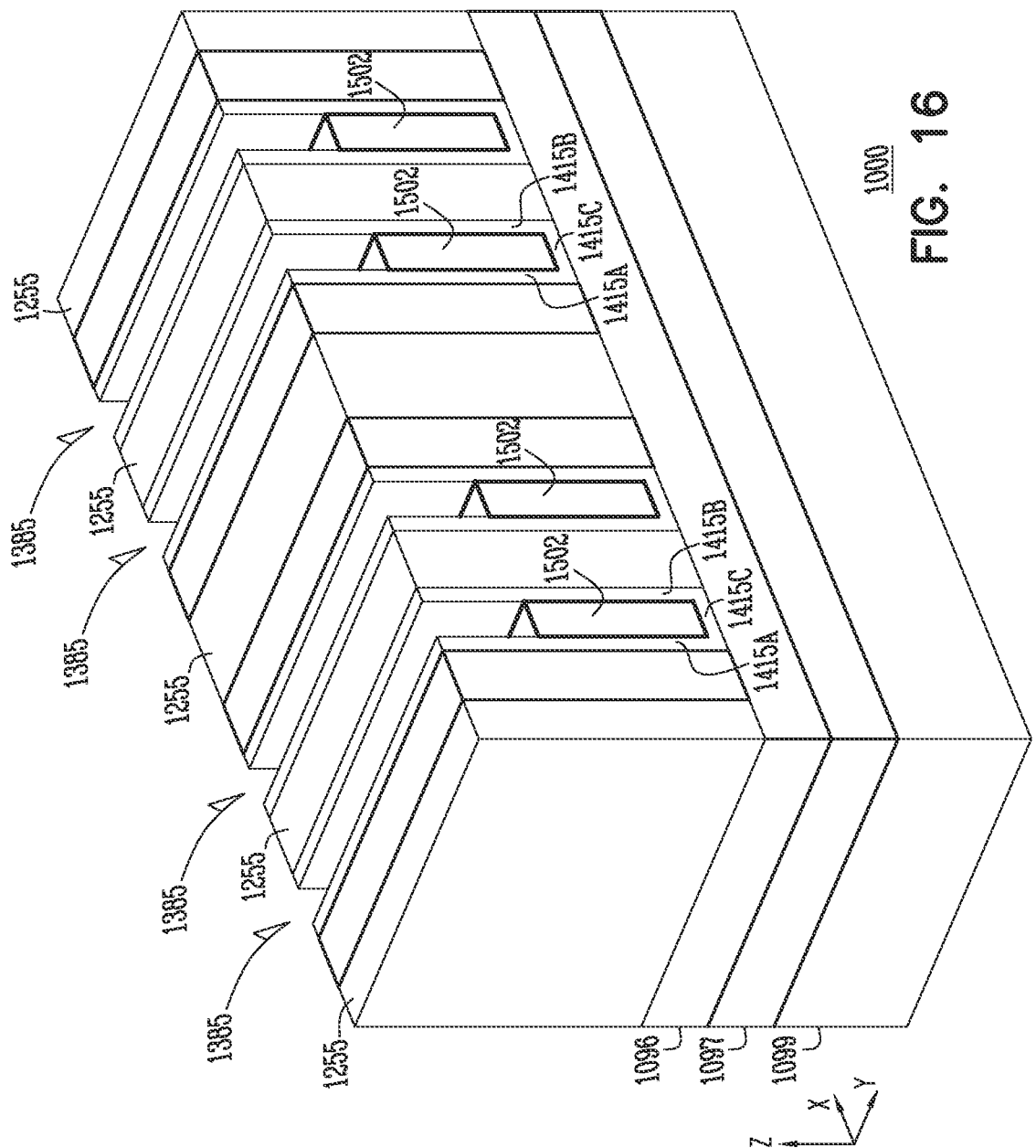

FIG. 16 shows memory device 1000 after a portion of material 1502 is removed (e.g., recessed) from each of trenches 1385. Remaining portions (a remaining part) of material 1502 in each of trenches 1385 are shown in FIG. 16. The processes of FIG. 16 can leave dielectric portions 1415A and 1415B on respective sidewalls 1385A and 1385B (labeled in FIG. 13) unremoved.

Figure 17:
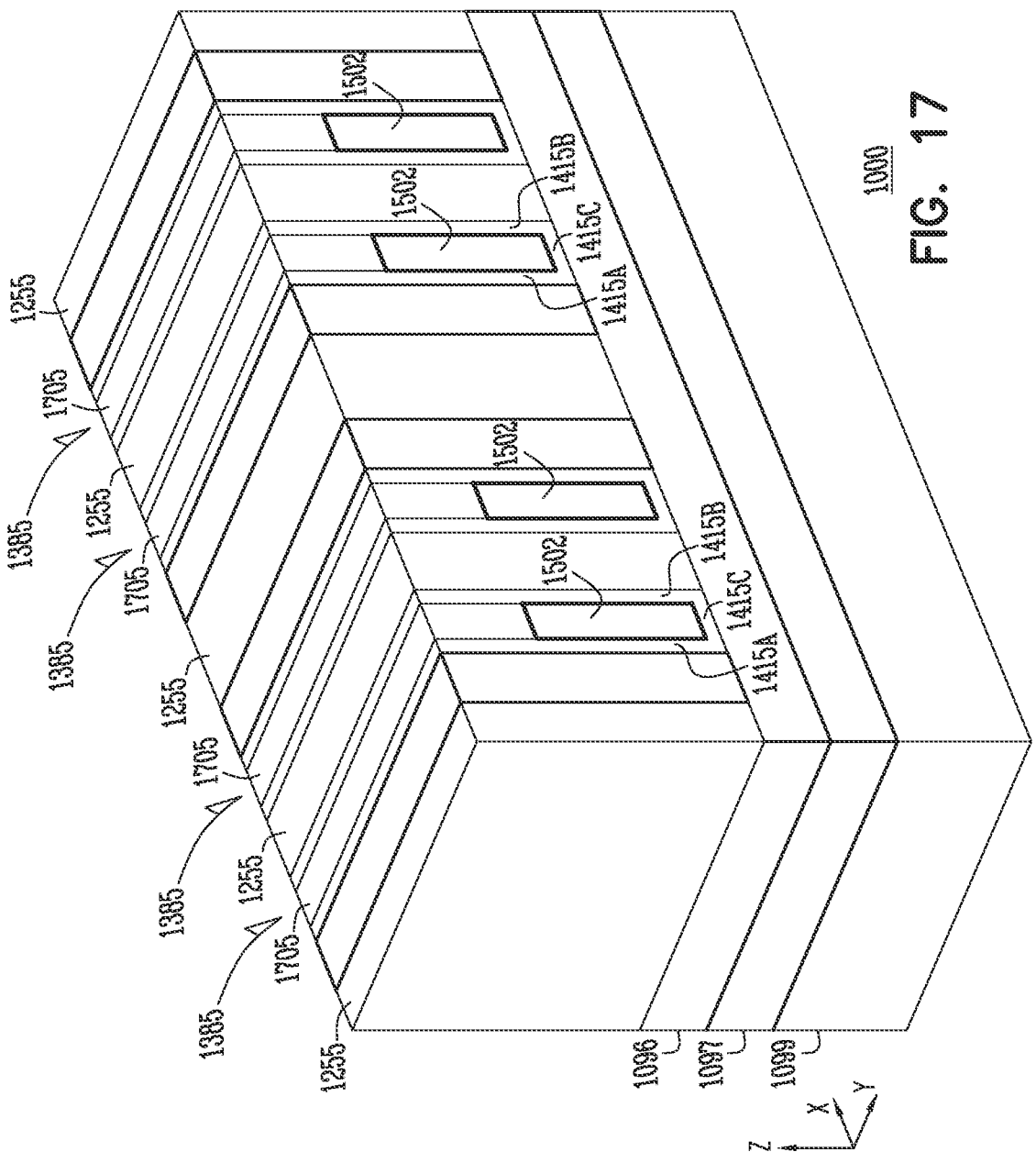

FIG. 17 shows memory device 1000 after a material (e.g., sacrificial material) 1705 is formed over material 1502 in each of trenches 1385. In subsequent processes (FIG. 22) of forming memory device 1000, material 1705 can be removed and replaced with a material that can form a write channel region of a transistor (e.g., transistor T2) of a respective memory cell of memory device 1000. Examples of material 1705 include carbon, silicon nitride, or other materials that can be selectively removed.

Figure 18:
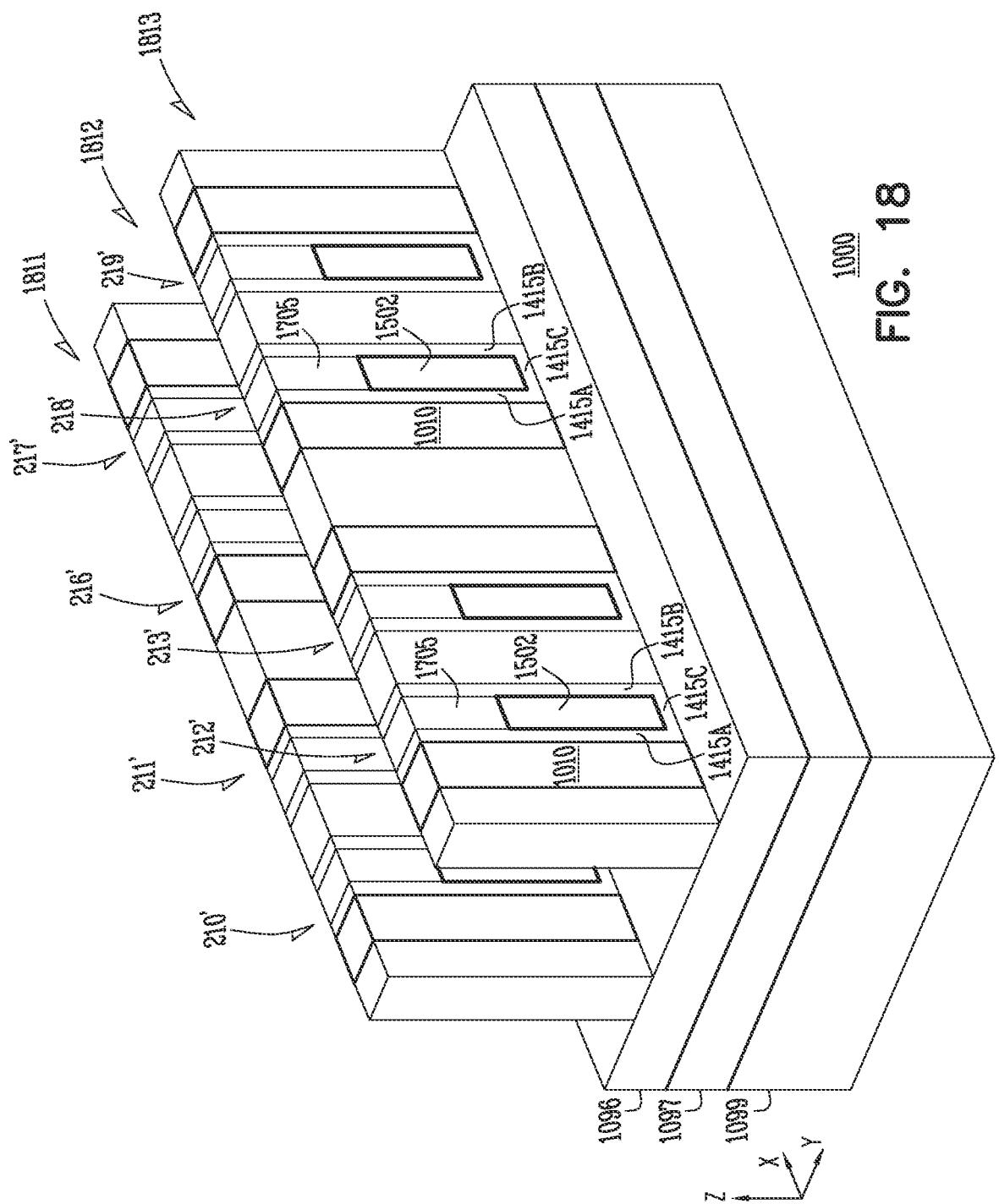

FIG. 18 shows memory device 1000 after trenches 1811, 1812, and 1813 are formed across (in the X-direction) the materials of memory device 100. Each of trenches 1811, 1812, and 1813 can have a length in the X-direction, a width (shorter than the length) in the Y-direction, and a bottom (not labeled) formed by a respective portion of semiconductor material 1096. In the structure of FIG. 18, memory device 1000 can include a common conductive structure (e.g., a common conductive plate) where semiconductor material 1096 and conductive material 1097 are part of common conductive structure. In an alternative structure (not shown in FIG. 18) of memory device 1000, each of trenches 1811, 1812, and 1813 can have a bottom (not labeled) formed from a respective portion of conductive material 1097 (instead of semiconductor material 1096).

In the FIG. 18, forming trenches 1811, 1812, and 1813 can include removing (e.g., by cutting (e.g., etching) in the Z-direction) part of the materials of memory device 1000 at locations of trenches 1811, 1812, and 1813 and leaving portions (e.g., slices) of the structure of memory device 1000 shown in FIG. 18. Remaining portions (a remaining part) of the materials of memory device 1000 shown in FIG. 18 can subsequently form the memory cells of memory device 1000. For example, as shown in FIG. 18, the remaining portions of memory device 1000 can be part of memory cells 210', 211', 216', and 217' (e.g., in one row along the X-direction) and memory cells 212', 213', 218', and 219' (e.g., in another row along the X-direction). Memory cells 210', 211', 216', and 217' can correspond to memory cells 210, 211, 216, and 217, respectively of memory device 200 of FIG. 7 and FIG. 8. Memory cells 212', 213', 218', and 219' can correspond to memory cells 212, 213, 218, and 219, respectively of memory device 200 of FIG. 7.

For simplicity, only some of similar elements (e.g., portions) of memory device 1000 in FIG. 18 are labeled. Memory cell 212' can include a dielectric structure that includes a combination of dielectric portions 1415A, 1415B, and 1415C. Memory cell 212' can also include material 1502 that can form a charge storage structure of memory cell 212'. Semiconductor material 1010 of memory cell 212' can form a read channel region of transistor T1 (not labeled) of memory cell 212'. A write channel region of transistor T2 (not labeled) has not been formed in the processes up to the processes associated with FIG. 18. In subsequent processes (after forming access lines of memory device 1000), a material (e.g., material 2320 in FIG. 23) will replace material (e.g., sacrificial material) 1705 to form write channel region of transistor T2 in a respective memory cell of memory device 1000.

Figure 19:
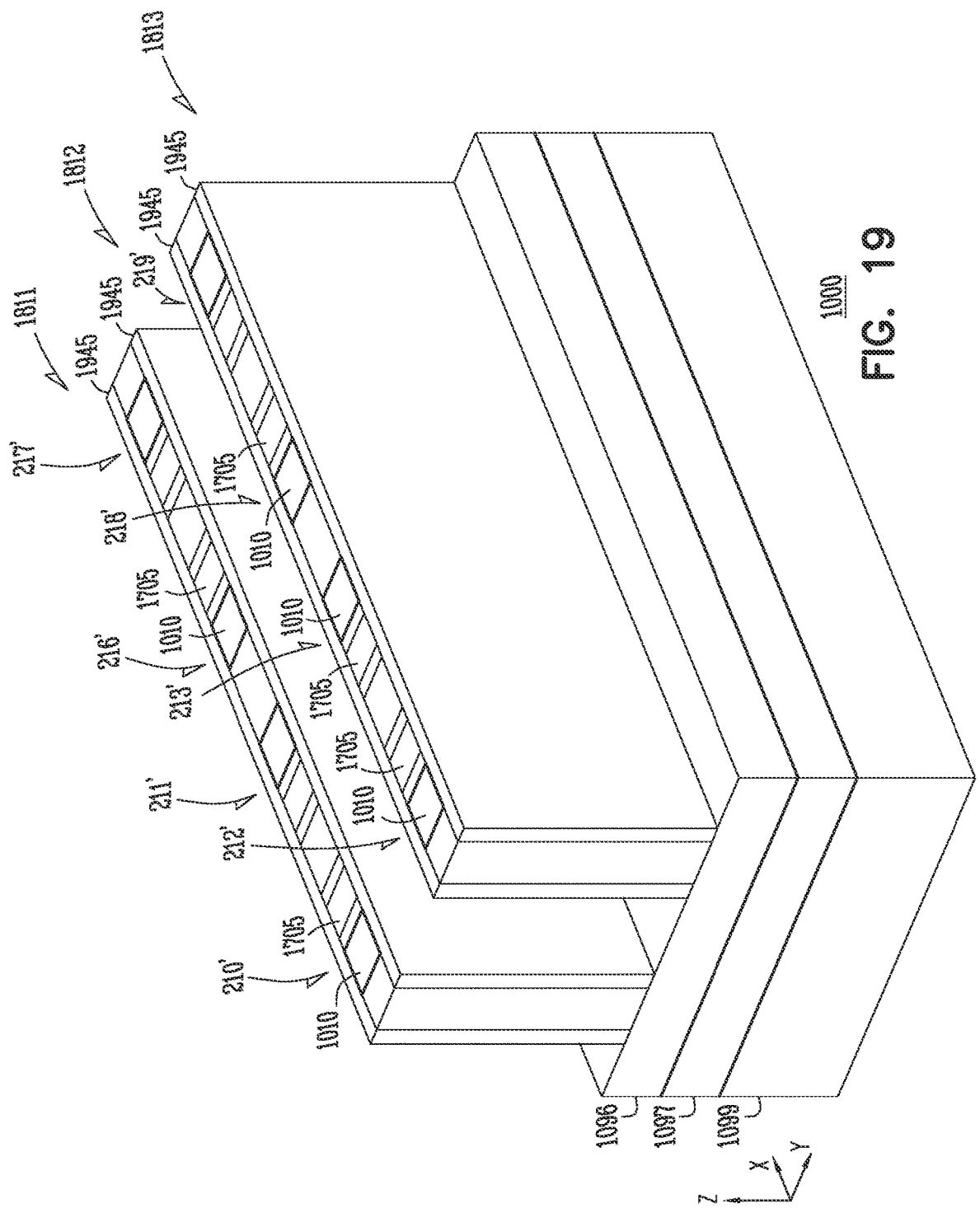

FIG. 19 shows memory device 1000 after dielectric materials 1945 are formed. Dielectric materials 1945 can form oxide regions (gate oxide regions) for transistors T1 and T2 (not labeled) of a respective memory cell of memory device 1000. The material (or materials) for dielectric materials 1945 can be similar to or the same as the material (or materials) of dielectric materials 545 of memory device 200 (FIG. 9). Example materials for dielectric materials 1945 can include silicon dioxide, hafnium oxide (e.g., HfO$_2$), aluminum oxide (e.g., Al$_2$O$_3$), or other dielectric materials (e.g., other high-k dielectric materials).

Figure 20:
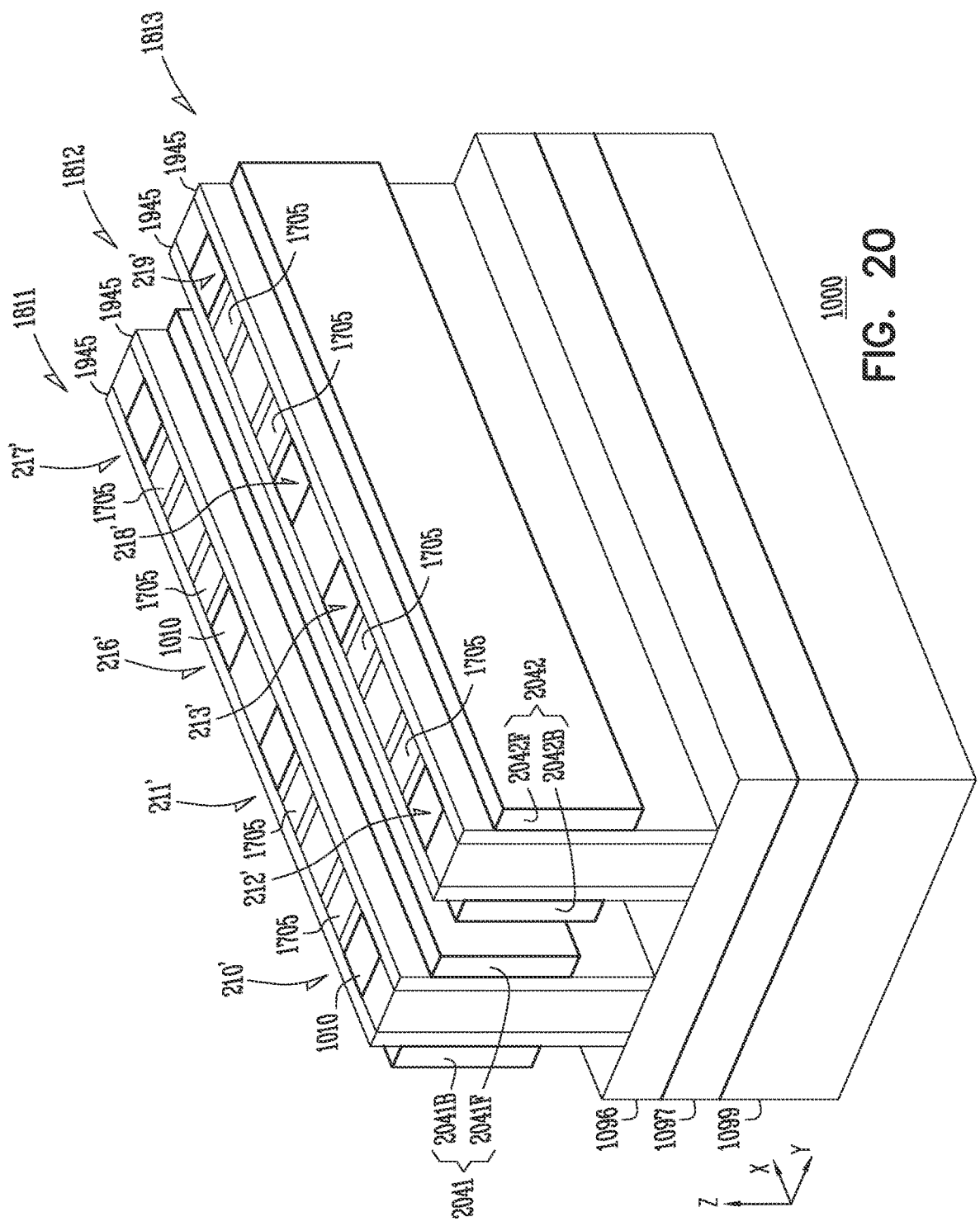

FIG. 20 shows memory device 1000 after conductive lines (e.g., conductive regions) 2041F, 2041B, 2042F, and 2042B are formed in respective trenches 1811, 1812, and 1813. Conductive lines 2041F and 2041B can correspond to portions (e.g., conductive lines) 514F and 541B, respectively, of memory device 200 (FIG. 8 and FIG. 9).

Figure 21:
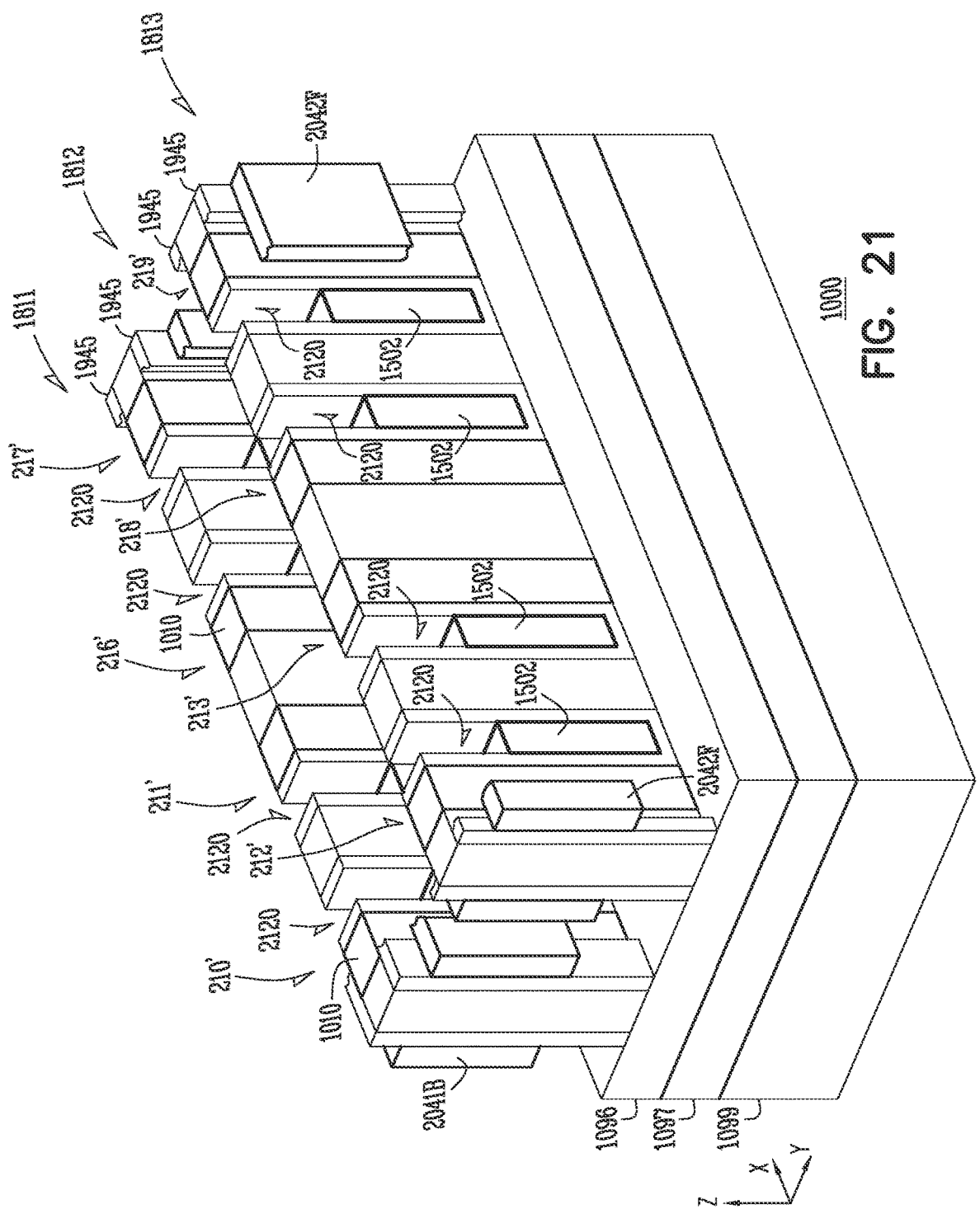

Each of conductive lines 2041F, 2041B, 2042F, and 2042B can include metal, conductively doped polysilicon, or other conductive materials. As shown in FIG. 21, conductive lines 2041F, 2041B, 2042F, and 2042B are electrically separated from the elements of memory cells 210', 211', 216', and 217' and memory cells 212', 213', 218', and 219' by respective dielectric materials (e.g., gate oxide regions) 1945.

Conductive lines 2041F and 2041B can form part of an access line (e.g., word line) 2041 to control access to (e.g., to control transistors T1 and T2, not labeled) of respective memory cells 210', 211', 216', and 217'. Conductive lines 2042F and 2042B can form part of an access line (e.g., word line) 2042 to control access to (e.g., to control transistors T1 and T2, not labeled) of respective memory cells 212', 213', 218', and 219'.

The processes associated with FIG. 20 can include forming a conductive connection (not shown) to electrically couple conductive lines 2041F and 2041B to each other. This allows conductive lines 2041F and 2041B to form part of or a single access line for memory cells 210', 211', 216', and 217'. Similarly, processes associated with FIG. 20 can include forming a conductive connection (not shown) to electrically couple conductive lines 2042F and 2042B to each other. This allows conductive lines 2042F and 2042B to form part of or a single access line for memory cells 212', 213', 218', and 219'.

FIG. 21 shows two conductive lines (e.g., conductive lines 2041F and 2041B) are formed on opposite sides (in the Y-direction) of a respective memory cell (memory cell 210') as an example. However, the processes of forming memory device 1000 in FIG. 21 can include forming only one conductive line (instead of two conductive lines) on a side (in one of trenches 1811, 1812, and 1813) of respective memory cells of memory device 1000. For example, the processes of forming memory device 1000 in FIG. 21 can include forming one conductive line (e.g., forming only conductive line 2041F without forming conductive line 2041B) for memory cells 210', 211', 216', and 217', and forming one conductive line (e.g., forming only conductive line 2042F without forming conductive line 2042B) for memory cells 212', 213', 218', and 219'.

FIG. 21 shows memory device 1000 after material (e.g., sacrificial material) 1705 (in FIG. 20) is removed. FIG. 21 (and also FIG. 22) shows cut-way views of dielectric material (e.g., gate oxide regions) 1945 and conductive lines 2041F, 2041B, 2042F, and 2042B of FIG. 20 to show details of material 1502 of memory device 100. In FIG. 21, removing material 1705 can include a selective etch process to remove material 1705 from trenches 1385 (labeled in FIG. 17). As shown in FIG. 21, recesses 2120 can be formed at the locations that were occupied by material 1705. Material 1502 is exposed at a respective recess 2120.

Figure 22:
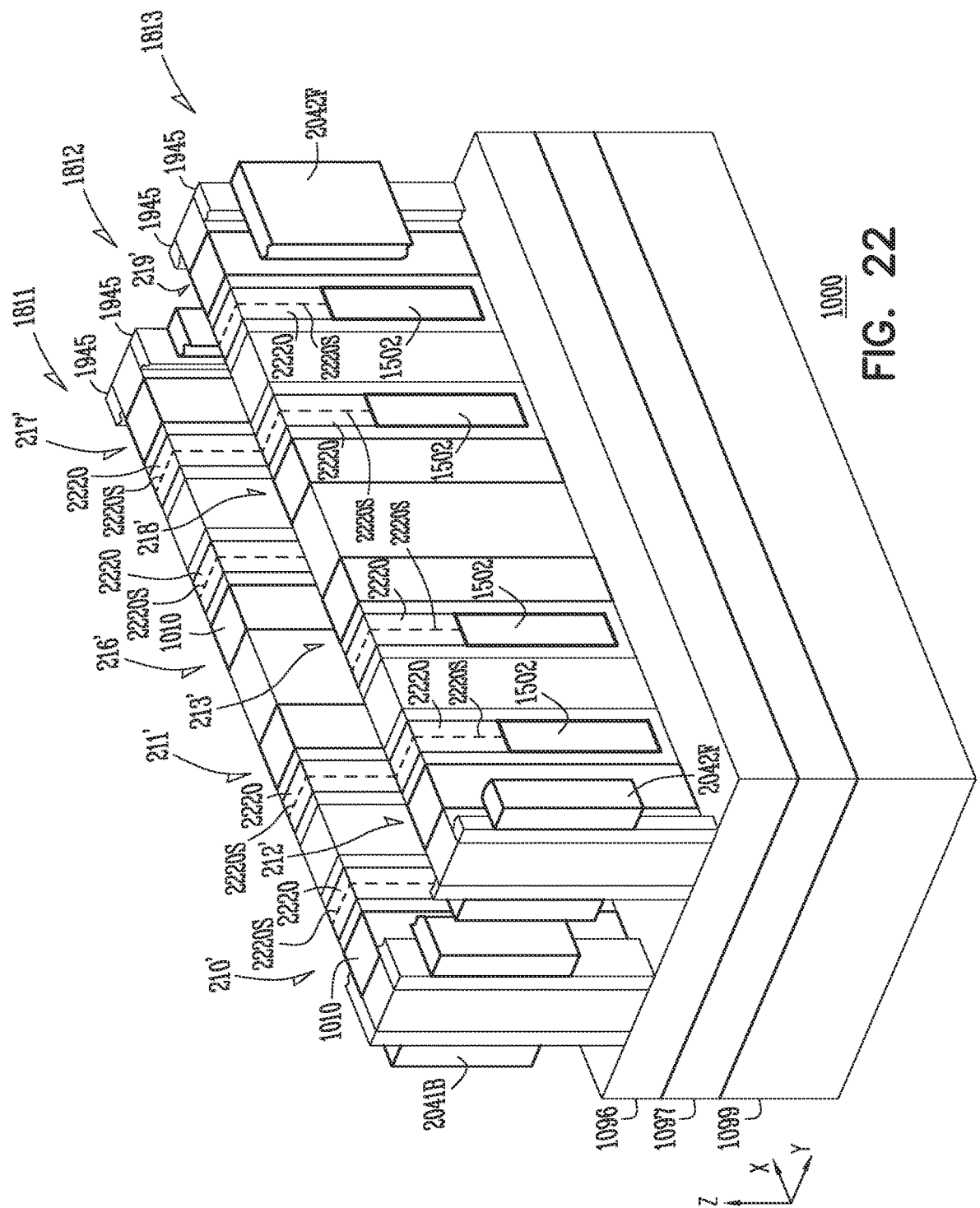

FIG. 22 shows memory device 1000 after a material 2220 is formed over (e.g., formed on) material 1502 in recesses 2120 (labeled in FIG. 21) of a respective memory cell. Material 2220 can be formed by depositing it over (e.g., on) material 1502 in recesses 2120. Since material 2220 is formed in recesses 2120, an additional process (e.g., an etch process, a CMP process, or both) performed on material 2220 may be omitted.

Material 2220 can be similar to or the same as material 520 of a respective memory cell of memory device 200 described above with reference to FIG. 5 through FIG. 9. Thus, material 2220 can include semiconducting oxide materials, transparent conductive oxide materials, and other oxide materials. Material 2220 can form a write channel region of transistor T2 of a respective memory cell of memory device 1000.

As shown in FIG. 22, material (e.g., semiconducting oxide material) 2220 can include a portion (not labeled) adjacent dielectric portion 1415A and between opposite sides (e.g., first and second sides in the X-direction) of material 2220, a portion (not labeled) adjacent dielectric portion 1415B and between the opposite sides of material 2220, and a seam 2220S at an interface between the portion adjacent dielectric portion 1415A and the portion adjacent dielectric portion 1415B. Seam 2220S includes the same material as material 2220. In the processes associated with FIG. 22, the presence of seam 2220S can be a result of the processes of forming material 2220.

Forming material 2220 as described above can provide improvement and benefit over some alternative processes. For example, in some alternative processes, material 2220 can be formed such that material 2220 may be gone under processes that can include an etching process, a CMP (chemical mechanical polishing or planarization) process, or both. Such alternative processes can degrade material 2220. Forming material 2220 as described above with reference to FIG. 10 through FIG. 22 can avoid degradation of material 2220. This can lead to a more reliable structure (e.g., write channel region of transistor T2) formed from material 2220.

Figure 23:
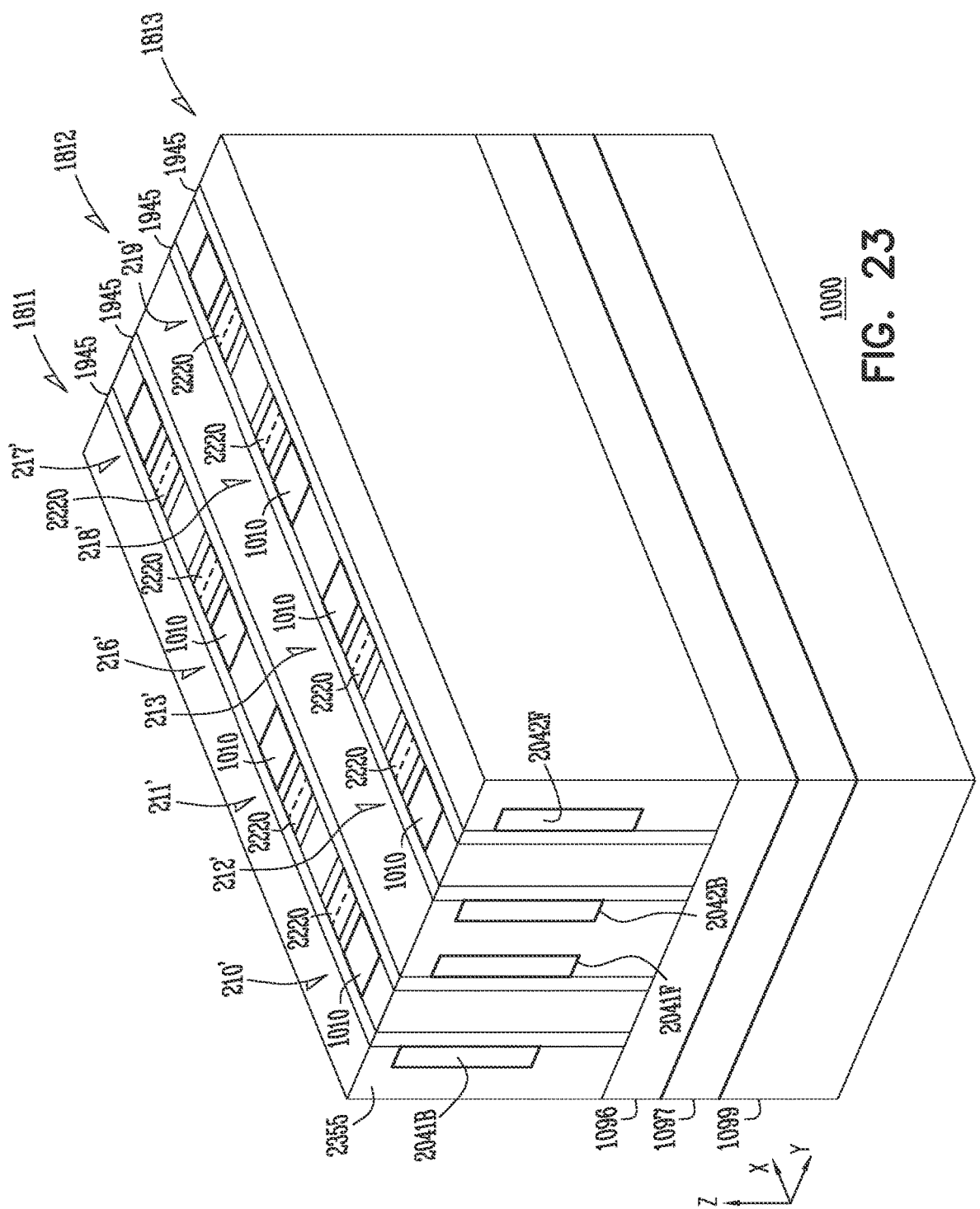

FIG. 23 shows memory device 1000 after material (e.g., dielectric material) 2355 is formed. Material 2355 can include silicon dioxide or other dielectric materials.

FIG. 24 shows memory device 1000 after data lines 2471, 2472, 2473, and 2474 are formed. Data lines 2471, 2472, 2473, and 2474 are electrically separated from each other. Each of data lines 2471, 2472, 2473, and 2474 can have a length in the Y-direction, a width in the X-direction, and a thickness in the Z-direction. Data lines 2471, 2472, 2473, and 2474 can correspond to data lines 271, 272, 273, and 274, respectively, of memory device 200 (FIG. 7 and FIG. 8).

The description of forming memory device 1000 with reference to FIG. 10 through FIG. 24 can include other processes to form a complete memory device. Such processes are omitted from the above description so as to not obscure the subject matter described herein.

Figure 25A:
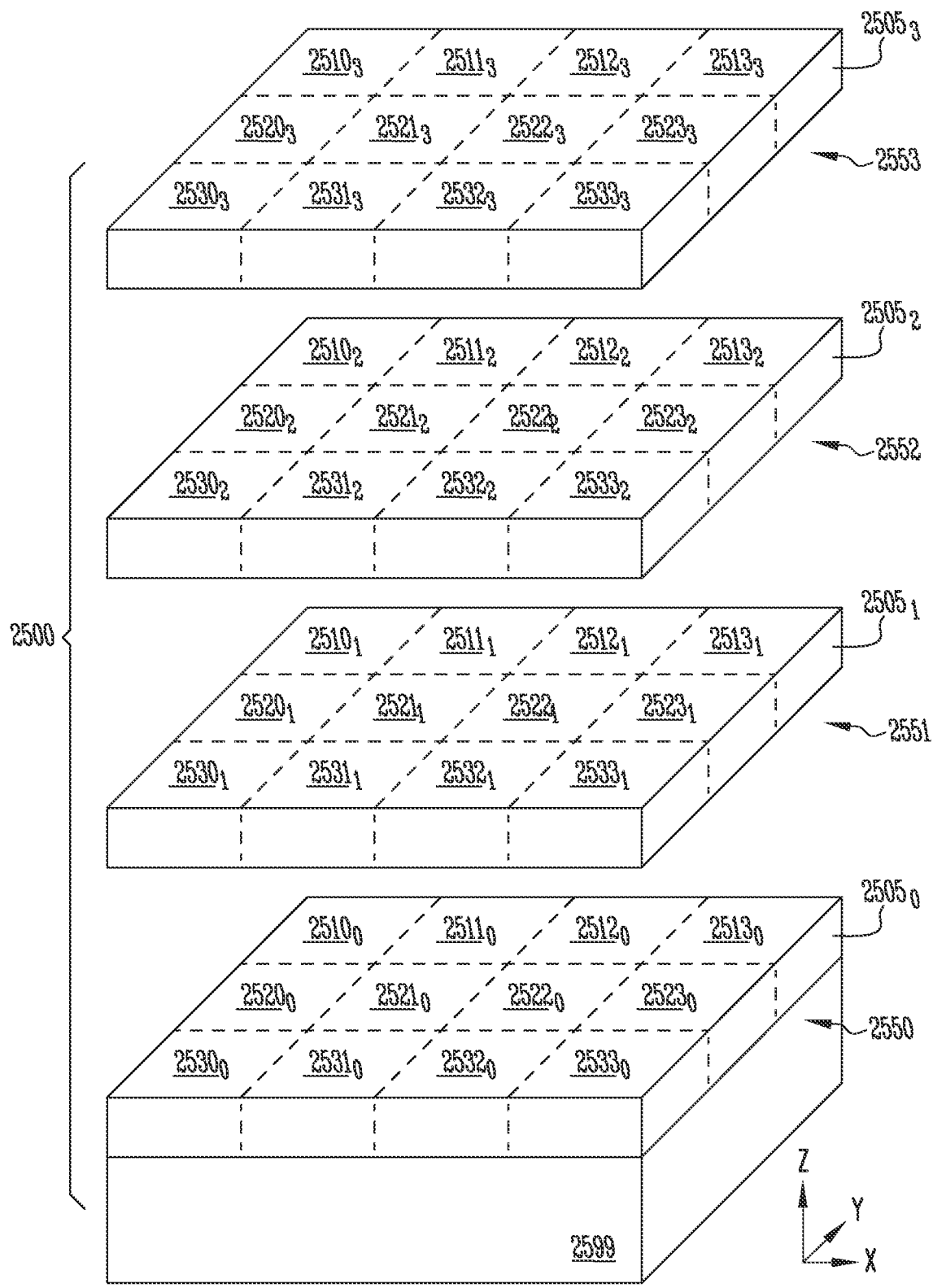
FIG. 25A, FIG. 25B, and FIG. 25C show different views of a structure of a memory device including multiple decks of memory cells, according to some embodiments described herein.
Figure 25B:
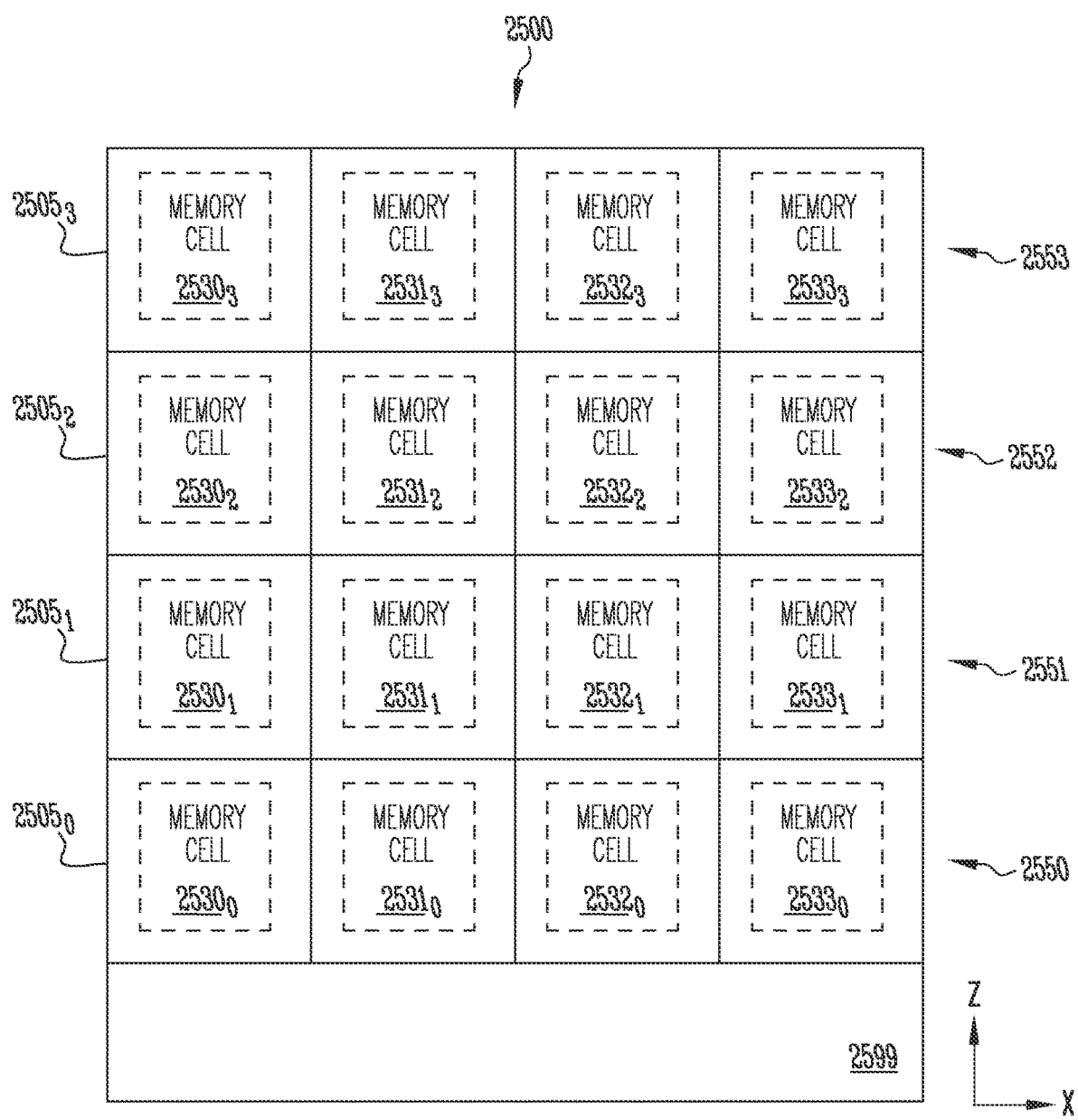
Figure 25C:
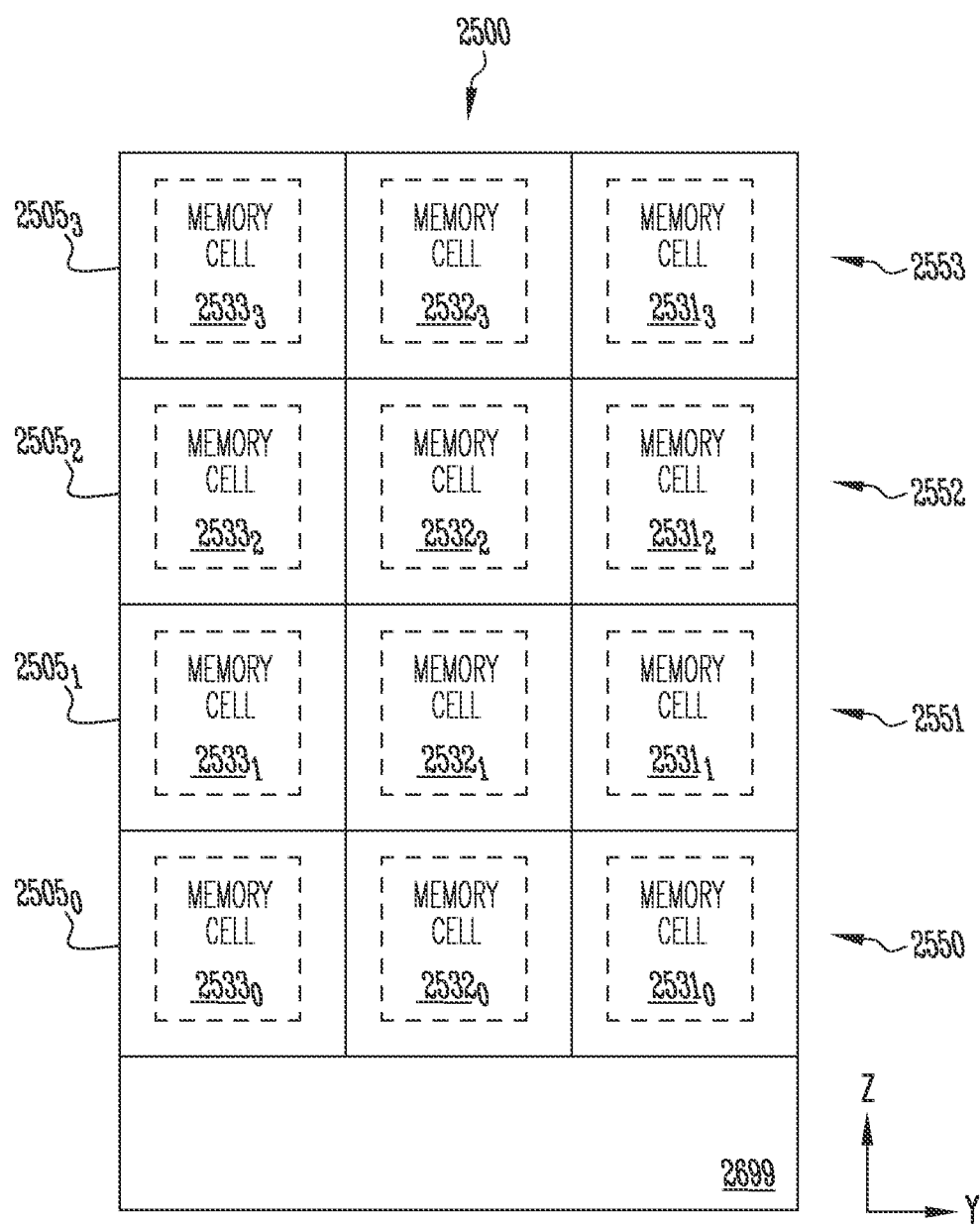

FIG. 25A, FIG. 25B, and FIG. 25C show different views of a structure of a memory device 2500 including multiple decks of memory cells, according to some embodiments described herein. FIG. 25A shows an exploded view (e.g., in the Z-direction) of memory device 2500. FIG. 25B shows a side view (e.g., cross-sectional view) in the X-direction and the Z-direction of memory device 2500. FIG. 25C shows a side view (e.g., cross-sectional view) in the Y-direction and the Z-direction of memory device 2500.

As shown in FIG. 25A, FIG. 25B, and FIG. 25C, memory device 2500 can include decks (decks of memory cells) $2505_0$, $2505_1$, $2505_2$, and $2505_3$ that are shown separately from each other in an exploded view to help ease of viewing the deck structure of memory device 2500. In reality, decks $2505_0$, $2505_1$, $2505_2$, and $2505_3$ can be attached to each other in an arrangement where one deck can be formed (e.g., stacked) over another deck over a substrate (e.g., a semiconductor (e.g., silicon) substrate) 2599. For example, as shown in FIG. 25A, decks $2505_0$, $2505_1$, $2505_2$, and $2505_3$ can be formed in the Z-direction perpendicular to substrate 2599 (e.g., formed vertically in the Z-direction with respect to substrate 2599).

As shown in FIG. 25A, FIG. 25B, and FIG. 25C, each of decks $2505_0$, $2505_1$, $2505_2$, and $2505_3$ can have memory cells arranged in the X-direction and the Y-direction (e.g., arranged in rows in the X-direction and in columns in the Y-direction). For example, deck $2505_0$ can include memory cells $2510_0$, $2511_0$, $2512_0$, and $2513_0$ (e.g., arranged in a row), memory cells $2520_0$, $2521_0$, $2522_0$, and $2523_0$ (e.g., arranged in a row), and memory cells $2530_0$, $2531_0$, $2532_0$, and $2533_0$ (e.g., arranged in a row).

Deck $2505_1$ can include memory cells $2510_1$, $2511_1$, $2512_1$, and $2513_1$ (e.g., arranged in a row), memory cells $2520_1$, $2521_1$, $2522_1$, and $2523_1$ (e.g., arranged in a row), and memory cells $2530_1$, $2531_1$, $2532_1$, and $2533_1$ (e.g., arranged in a row).

Deck $2505_2$ can include memory cells $2510_2$, $2511_2$, $2512_2$, and $2513_2$ (e.g., arranged in a row), memory cells $2520_2$, $2521_2$, $2522_2$, and $2523_2$ (e.g., arranged in a row), and memory cells $253_0$, $2531_2$, $2532_2$, and $2533_2$ (e.g., arranged in a row).

Deck $2505_3$ can include memory cells $2510_3$, $2511_3$, $2512_3$, and $2513_3$ (e.g., arranged in a row), memory cells $2520_3$, $2521_3$, $2522_3$, and $2523_3$ (e.g., arranged in a row), and memory cells $2530_3$, $2531_3$, $2532_3$, and $2533_3$ (e.g., arranged in a row).

As shown in FIG. 25A, FIG. 25B, and FIG. 25C, decks $2505_0$, $2505_1$, $2505_2$, and $2505_3$ can be located (e.g., formed vertically in the Z-direction) on levels (e.g., portions) 2550, 2551, 2552, and 2553, respectively, of memory device 2500. The arrangement of decks $2505_0$, $2505_1$, $2505_2$, and $2505_3$ forms a 3-dimensional (3-D) structure of memory cells of memory device 2500 in that different levels of the memory cells of memory device 2500 can be located (e.g., formed) in different levels (e.g., different vertical portions) 2550, 2551, 2552, and 2553 of memory device 2500.

Decks $2505_0$, $2505_1$, $2505_2$, and $2505_3$ can be formed one deck at a time. For example, decks $2505_0$, $2505_1$, $2505_2$, and $2505_3$ can be formed sequentially in the order of decks $2505_0$, $2505_1$, $2505_2$, and $2505_3$ (e.g., deck $2505_1$ is formed first and deck $2505_3$ is formed last). In this example, the memory cell of one deck (e.g., deck $2505_1$) can be formed either after formation of the memory cells of another deck (e.g., deck $2505_0$) or before formation of the memory cells of another deck (e.g., deck $2505_2$). Alternatively, decks $2505_0$, $2505_1$, $2505_2$, and $2505_3$ can be formed concurrently (e.g., simultaneously), such that the memory cells of decks $2505_0$, $2505_1$, $2505_2$, and $2505_3$ can be concurrently formed. For example, the memory cells in levels 2550, 2551, 2552, and 2553 of memory device 2500 can be concurrently formed.

The structures decks $2505_0$, $2505_1$, $2505_2$, and $2505_3$ can include the structures of memory devices described above with reference to FIG. 1 through FIG. 24.

Memory device 2500 can include data lines (e.g., bit lines) and access lines (e.g., word lines) to access the memory cells of decks $2505_0$, $2505_1$, $2505_2$, and $2505_3$. For simplicity, data lines and access lines of memory cells are omitted from FIG. 25A. However, the data lines and access lines of memory device 2500 can be similar to the data lines and access lines, respectively, of the memory devices described above with reference to FIG. 1 through FIG. 24.

FIG. 25A, FIG. 25B, and FIG. 25C show memory device 2500 including four decks (e.g., $2505_0$, $2505_1$, $2505_2$, and $2505_3$) as an example. However, the number of decks can be different from four. FIG. 25A shows each of decks $2505_0$, $2505_1$, $2505_2$, and $2505_3$ including one level (e.g., layer) of memory cells as an example. However, at least one of the decks (e.g., one or more of decks $2505_0$, $2505_1$, $2505_2$, and $2505_3$) can have two (or more) levels of memory cells. FIG. 25A shows an example where each of decks $2505_0$, $2505_1$, $2505_2$, and $2505_3$ includes four memory cells (e.g., in a row) in the X-direction and three memory cells (e.g., in a column) in the Y-direction. However, the number of memory cells in a row, in a column, or both, can vary. Since memory device 2500 can include the structures of memory devices 200 and 1000, memory device 2500 can also have improvements and benefits like memory devices 200 and 1000.

The illustrations of apparatuses (e.g., memory devices 100, 200, 900, and 2500) and methods (e.g., methods of forming memory device 1000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 1000, and 2500) or a system (e.g., an electronic item that can include any of memory devices 100, 200, 1000, and 2500).

Any of the components described above with reference to FIG. 1 through FIG. 25C can be implemented in a number of ways, including simulation via software. Thus, apparatuses (e.g., memory devices 100, 200, 1000, and 2500) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 1000, and 2500) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 25C include apparatuses and methods of operating the apparatuses. One of the apparatuses includes a memory cell including a first transistor, a second transistor, and a dielectric structure formed in a trench. The first transistor includes a first channel region, and a charge storage structure separated from the first channel region. The second transistor includes a second channel region formed over the charge storage structure. The dielectric structure includes a first dielectric portion formed on a first sidewall of the trench, and a second dielectric portion formed on a second sidewall of the trench. The charge storage structure is between and adjacent the first and second dielectric portions. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A. B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a memory cell including:
a first transistor including a first channel region, and a charge storage structure separated from the first channel region;
a second transistor including a second channel region formed over the charge storage structure, wherein a direction from the second channel region to the charge storage structure is a first direction; and
a dielectric structure formed in a trench, the dielectric structure including a first dielectric portion formed on a first sidewall of the trench, and a second dielectric portion formed on a second sidewall of the trench, wherein the charge storage structure is between and adjacent the first and second dielectric portions;
an additional dielectric material different from the second dielectric portion and contacting the second dielectric portion, wherein the second dielectric portion is between the charge storage structure and the additional dielectric material, and a direction from the charge storage structure to the additional dielectric material is a second direction perpendicular to the first direction.

2. The apparatus of claim 1, wherein the first channel region and the second channel region have different conductivity types.

3. The apparatus of claim 1, wherein the second channel region includes semiconducting oxide material.

4. The apparatus of claim 1, wherein the first channel includes a semiconductor material that is blanket deposited with a dopant grading and activated.

5. The apparatus of claim 3, further comprising a conductive region separated from the first channel region and the second channel region, wherein the conductive region forms a gate of the first transistor and a gate of the second transistor.

6. The apparatus of claim 1, wherein the first channel region is coupled to a ground connection.

7. The apparatus of claim 1, wherein the second channel region includes at least one of zinc tin oxide (ZTO), indium zinc oxide (IZO), zinc oxide (ZnOx), indium gallium zinc oxide (IGZO), indium gallium silicon oxide (IGSO), indium oxide (InO$_x$, In$_2$O$_3$), tin oxide (SnO$_2$), titanium oxide (TiOx), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

8. An apparatus comprising:
a semiconductor material;
a dielectric structure formed in a trench adjacent the semiconductor material, the dielectric structure including:
a first dielectric portion formed on a first sidewall of the trench, and a second dielectric portion formed on a second sidewall of the trench; and
a third dielectric portion between and coupled to the first and second dielectric portions; and
a charge storage structure formed on the third dielectric portion and between the first and second dielectric portions;

an additional dielectric material different from the second dielectric portion and contacting the second dielectric portion;
a semiconducting oxide material formed on the charge storage structure, wherein a direction from the semiconducting oxide material to the charge storage structure a first direction, and wherein the second dielectric portion is between the charge storage structure and the additional dielectric material, and a direction from the charge storage structure to the additional dielectric material is a second direction perpendicular to the first direction, the semiconducting oxide material includes a first portion adjacent the first dielectric portion, a second portion adjacent the second dielectric portion, and a seam at an interface between the first and second portions of the semiconducting oxide material, wherein the semiconductor material, the charge storage structure, and the semiconducting oxide material are part of a memory cell of the apparatus.

9. The apparatus of claim 8, wherein the semiconductor material and the semiconducting oxide material have different conductivity types.

10. The apparatus of claim 8, wherein the semiconducting oxide material includes indium.

11. The apparatus of claim 8, further comprising a conductive region contacting the semiconductor material and the semiconducting oxide material.

12. An apparatus comprising:
a semiconductor material;
a charge storage structure located on a side of the semiconductor material;
a semiconducting oxide material formed on the charge storage structure, wherein a direction from the semiconducting oxide material to the charge storage structure a first direction;
a dielectric structure formed in a trench, the dielectric structure including:
a first dielectric portion formed on a first sidewall of the trench, and a second dielectric portion formed on a second sidewall of the trench, wherein the charge storage structure and the semiconducting oxide material are between the first and second dielectric portions, and the semiconducting oxide material includes a first side contacting the first dielectric portion and a second side contacting the second dielectric portion;
a third dielectric portion between and coupled to the first and second dielectric portions, wherein the charge storage structure is formed on the third dielectric portion, and wherein the semiconductor material, the charge storage structure, and the semiconducting oxide material are part of a memory cell of the apparatus; and
an additional dielectric material different from the second dielectric portion and contacting the second dielectric portion, wherein the second dielectric portion is between the charge storage structure and the additional dielectric material, and a direction from the charge storage structure to the additional dielectric material is a second direction perpendicular to the first direction.

13. The apparatus of claim 12, wherein:
the semiconductor material forms a first channel region of a first transistor of the memory cell; and
the semiconducting oxide material forms a second channel region of a second transistor of the memory cell.

14. The apparatus of claim 12, wherein the semiconductor material has a p-type conductivity and semiconducting oxide material has an n-type conductivity.

15. The apparatus of claim 12, wherein the semiconductor material is blanket deposited with a dopant grading and activated.

16. The apparatus of claim 12, further comprising a conductive region contacting the semiconductor material and the semiconducting oxide material.

17. The apparatus of claim 12, further comprising a conductive region electrically separated from the semiconductor material, semiconducting oxide material, and the charge storage structure, wherein the conductive region spans across part of the semiconductor material, semiconducting oxide material, and the charge storage structure.

18. An apparatus comprising:
a first memory cell including:
a first transistor including a first channel region, and a first charge storage structure separated from the first channel region;
a second transistor including a second channel region formed over the first charge storage structure, wherein a direction from the second channel region to the first charge storage structure is a first direction; and
a first dielectric structure formed in a first trench, the first dielectric structure including a first dielectric portion formed on a first side wall of the first trench, and a second dielectric portion formed on a second sidewall of the first trench, wherein the charge storage structure is between and adjacent the first and second dielectric portions;
a second memory cell including:
a third transistor including a third channel region, and a second charge storage structure separated from the third channel region;
a fourth transistor including a fourth channel region formed over the second charge storage structure; and
a second dielectric structure formed in a second trench, the second dielectric structure including a third dielectric portion formed on a first sidewall of the second trench, and a fourth dielectric portion formed on a second sidewall of the second trench, wherein the second charge storage structure is between and adjacent the third and fourth dielectric portions; and
an additional dielectric material different from the second dielectric portion and the third dielectric portion and contacting the second dielectric portion and the third dielectric portion, wherein the second dielectric portion is between the first charge storage structure and the additional dielectric material, and a direction from the first charge storage structure to the additional dielectric material is a second direction perpendicular to the first direction.

19. The apparatus of claim 18, further comprising:
a first data line coupled to the first and second channel regions; and
a second data line coupled to the third and fourth channel regions.

20. The apparatus of claim 18, further comprising a conductive line electrically separated from the first, second, third, and fourth channel regions, wherein the conductive line spans across part of the first, second, third, and fourth channel regions.

* * * * *